(12) United States Patent
Kim et al.

(10) Patent No.: US 8,164,148 B2
(45) Date of Patent: Apr. 24, 2012

(54) METHOD OF GENERATING STRONG SPIN WAVES AND SPIN DEVICES FOR ULTRA-HIGH SPEED INFORMATION PROCESSING USING SPIN WAVES

(75) Inventors: Sang-Koog Kim, Seoul (KR); Ki-Suk Lee, Seoul (KR); Sang-Kook Choi, Seoul (KR)

(73) Assignee: Seoul National University Industry Foundation, Seoul (KR)

( * ) Notice: Subject to any disclaimer, the term of this patent is extended or adjusted under 35 U.S.C. 154(b) by 1060 days.

(21) Appl. No.: 12/064,060

(22) PCT Filed: Sep. 28, 2006

(86) PCT No.: PCT/KR2006/003874
§ 371 (c)(1),
(2), (4) Date: Feb. 18, 2008

(87) PCT Pub. No.: WO2007/037625
PCT Pub. Date: Apr. 5, 2007

(65) Prior Publication Data
US 2008/0231392 A1    Sep. 25, 2008

(30) Foreign Application Priority Data

Sep. 29, 2005 (KR) .......................... 10-2005-0091506
Sep. 25, 2006 (KR) .......................... 10-2006-0092742

(51) Int. Cl.
*G11B 5/66* (2006.01)
*H01L 27/105* (2006.01)

(52) U.S. Cl. .............................. 257/421; 438/3; 333/147

(58) Field of Classification Search .................. 257/421; 438/3; 333/147
See application file for complete search history.

(56) References Cited

U.S. PATENT DOCUMENTS

| 6,356,165 B1 | 3/2002 | Kim et al. |
| 2005/0023938 A1 | 2/2005 | Sato et al. |

FOREIGN PATENT DOCUMENTS

JP          07-30308          1/1995
(Continued)

OTHER PUBLICATIONS

Ki-Suk Lee, SangKook Choi, and Sang-Koog Kim "Radiation of spin waves from magnetic vortex cores by their dynamic motion and annihilation processes" Appl. Phys. Lett. 87, 192502 (2005).*

(Continued)

*Primary Examiner* — Bradley K Smith
*Assistant Examiner* — Jami M Valentine
(74) *Attorney, Agent, or Firm* — Ladas & Parry LLP

(57) ABSTRACT

Provided are a method of generating strong spin waves, a method of simultaneously generating spin waves and electromagnetic waves, a logic operation device using spin waves, a variety of spin wave devices employing the same, and a method of controlling phases of spin waves. In the method of generating spin waves, strong spin waves are generated by supplying various shapes of energies to a magnetic material in which a magnetic vortex and magnetic antivortex spin structures exist separately or together. In the logic operation device, wave factors of frequency, wavelength, amplitude, and phase of a spin wave generated by the method of generating spin waves are controlled and wave characteristics such as reflection, refraction, transmission, tunneling, superposition, interference, and diffraction are used.

46 Claims, 34 Drawing Sheets

FOREIGN PATENT DOCUMENTS

JP          10-135709          5/1998

OTHER PUBLICATIONS

T. Okuno, K. Mibu, and T. Shinjo "Two types of magnetic vortex cores in elliptical permalloy dots" J. Appl. Phys. 95, 3612 (2004).*

V. Novosad, et al; "Spin excitations of magnetic vortices in ferromagnetic nanodots", Physical Review B 66, Aug. 9, 2002, pp. 052407-1 thru 052407-4.

Ki-Suk Lee, et al; "Radiation of spin waves from magnetic vortex cores by their dynamic motion and annihilation processes", Applied Physics Letters 87, Issue 19, Nov. 7, 2005, pp. 192502-1-192502-3.

Sang-Koog Kim et al; "Vortex-antivortex assisted magnetization dynamics in a semi-continuous thin-film model system studied by micromagnetic simulations", Applied Physics Letter, vol. 86, No. 5, Jan. 31, 2005 , pp. 052504-1-052504-3.

International Search Report mailed Dec. 22, 2006; PCT/KR2006/003874.

* cited by examiner t=544(ps)

t=583(ps)

t=654(ps)

Applied field(Oe)

| A | B | out |
|---|---|---|
| "1" | "1" | "1" |
| "1" | "0" | "0" |
| "0" | "1" | "0" |
| "0" | "0" | "0" |

| A | B | out |
|---|---|---|
| "1" | "1" | "1" |
| "1" | "0" | "0" |
| "0" | "1" | "0" |
| "0" | "0" | "0" |

METHOD OF GENERATING STRONG SPIN WAVES AND SPIN DEVICES FOR ULTRA-HIGH SPEED INFORMATION PROCESSING USING SPIN WAVES

TECHNICAL FIELD

The present invention relates to a method and a device for generating strong spin waves, and more particularly, to a method of generating a dipole-exchange spin wave having a wavelength of several nm to several μm and having a frequency band of several hundreds of MHz to several tens of GHz and a device for generating spin waves having a configuration for implementing the method, and an information processing device to perform logic operations using the spin waves. In the present specification, a device for generating spin waves and an information processing device using the same are referred to as spin wave devices.

BACKGROUND ART

CMOS-based information processing methods are expected to be limited for the following reasons. Firstly, the thickness of a gate oxide layer should be gradually decreased as an integration degree is improved. However, when the thickness of the gate oxide layer is about 0.7 nm, electrons transmit the gate oxide layer and the gate oxide layer does not serve as an insulating layer any more. Secondly, when the widths of conducting wires are reduced for improvements in the integration degree, a short of the conducting wires occurs due to an increase of current density.

In order to replace CMOS-based information processing methods, a study for information processing methods using spins which are quantum characteristics of electrons, has been made breaking from information processing methods by electrons, that is, the movement of charges. For example, a study for a magnetic quantum cell automatic device using soliton in nano magnetic materials and a study for spin waves generated in magnetic materials to transmission and processing of information have been made.

Spin waves mean that spins make collective movements in the shape of waves. When an energy is applied to magnetic materials such as ferromagnetic materials, antiferromagnetic materials or ferrimagnetic materials, spins inside the magnetic materials make a precessional motion, and precessional motions of respective spins are wave-shaped by a magnetic interaction between the spins, such as dipole-dipole interaction or exchange interaction. The waves are spin waves.

Spin waves are classified into several types of waves according to dominant interactions: a first type is a magnetostatic wave in which a dipole-dipole interaction acts dominantly and which has a wavelength of several μm to several cm; a second type is an exchange spin wave in which an exchange interaction acts dominantly and which has a wavelength of less than several nm; and a third type is a dipole-exchange spin wave in which two interactions act competitively and which has a wavelength of several nm to several μm. The magnetostatic wave has been currently studied for applicable aspects and has been used for a device for high-frequency signal processing.

A method of generating spin waves used in an existing magnetostatic wave device is as follows (for example, U.S. Pat. Nos. 4,208,639, 4,316,162 and 5,601,935). When an electromagnetic wave is generated by flowing a high-frequency alternating current (AC) through a conducting wire formed on a thin film surface of ferrimagnetic materials such as YIG, a high-frequency magnetostatic wave is generated due to strong coupling of the generated electromagnetic wave and a magnetostatic wave of ferrimagnetic materials and travels toward an inside of the magnetic material. The wavelength of the magnetostatic wave generated in this way usually has the size of 10 μm to 1 mm. The core of this method is to apply a magnetic field to a local area of the magnetic material through a conducting wire and to generate and to propagate spin waves.

The wavelengths of spin waves should be several nm and the frequencies of the spin waves should be equal to or greater than GHz so that an information processing device using spin waves becomes a new-concept ultra-high speed information processing device for replacing an existing CMOS-based information processing method, and the generation of spin waves locally should be possible in a several nm to several hundreds of nm-size area of a device. However, since an induction field due to a current flowing through the conducting wire is formed to a size that is in inverse proportion to a distance even in a distant area from the conducting wire, in a device using an existing magnetostatic wave, all areas of the device are included in the effect of a magnetic field and spin waves cannot be generated in a local area.

Thus, a method of generating dipole-exchange spin waves is firstly needed for an information processing device using spin waves. However, a study for using exchange spin waves and dipole-exchange spin waves in a device has proceeded hardly. Japanese Patent Laid-open Publication No. Hei 6-097562 discloses a conceptual method of generating spin waves by causing a change of a magnetic interaction inside a magnetic material by applying an energy to the magnetic material, and an example thereof is a method of making spin waves in a bottom state into an excitation state by radiating Cu—K X-rays to the magnetic material. However, a method of generating spin waves by the supply of the energy presented here is just a general method of generating spin waves in a magnetic material, and a method of generating strong spin waves in a local area for the use in an information processing device for spin waves has not been presented.

DETAILED DESCRIPTION OF THE INVENTION

Technical Problem

Figure 1:
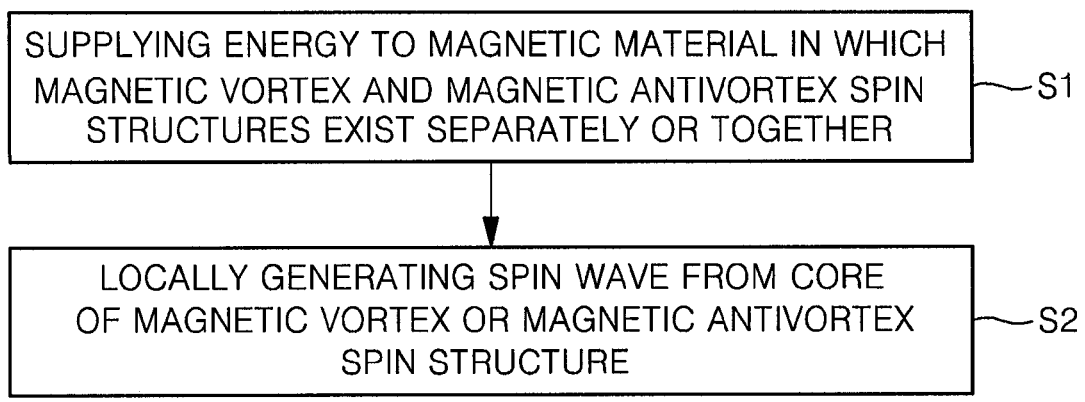
FIG. 1 is a flowchart illustrating a method of generating spin waves according to an embodiment of the present invention.

The present invention provides a method of generating dipole-exchange spin waves having wavelengths of several nm to several μm and having a frequency band of several hundreds of MHz to several tens of GHz in a local area of a size of several nm to several hundreds of nm that is required in an information processing device using spin waves, and a method of generating electromagnetic waves having the same frequencies as those of spin waves simultaneously with the generation of the spin waves.

The present invention also provides a device for generating spin waves having a configuration for implementing a method of generating spin waves according to the present invention.

The present invention also provides a spin wave device for information processing to perform logic operations using spin waves generated by the method of generating spin waves according to the present invention.

The present invention also provides a method of controlling the phases of spin waves to implement various spin wave devices for information processing.

Technical Solution

According to an aspect of the present invention, there is provided a method of generating spin waves, the method including: supplying an energy to a magnetic material in which magnetic vortex and magnetic antivortex spin structures exist separately or together; and locally generating a spin wave from a core of the magnetic vortex or the magnetic antivortex spin structure or while two vortexes collide with each other and annihilate, according to a supply of the energy.

According to another aspect of the present invention, there is provided a method of generating electromagnetic waves and spin waves, the method including: supplying an energy to a magnetic material in which magnetic vortex and magnetic antivortex spin structures exist separately or together; and locally generating a spin wave from a core of the magnetic vortex or the magnetic antivortex spin structure or while two vortexes collide with each other and annihilate, according to a supply of the energy, and simultaneously generating an electromagnetic wave having the same frequency as that of the spin wave.

According to another aspect of the present invention, there is provided a spin wave device, the spin wave device including: a spin wave-generating unit formed of a magnetic material in which magnetic vortex and magnetic antivortex spin structures exist separately or together; an energy-supplying unit supplying an energy to the spin wave-generating unit; and a spin-wave waveguide propagating a spin wave generated from a core of the magnetic vortex or the magnetic antivortex spin structure according to the supply of the energy, from the spin wave-generating unit.

In the spin wave device according to the present invention, the magnetic material may have shape and dimension so that the magnetic vortex and magnetic antivortex spin structures exist separately or together therein. The energy-supplying unit may supply one energy selected from the group consisting of a magnetic field, an electric field, a voltage, a current, an electromagnetic wave, sound, heat, a magnetoelastic energy, and a combination thereof. The spin wave-generating unit and/or the spin-wave waveguide may be all existing magnetic materials. Among them, for example, the magnetic material and the spin-wave waveguide may include one selected from the group consisting of ferromagnetic materials, antiferromagnetic materials, ferrimagnetic materials, alloy-based magnetic materials, oxide-based magnetic materials, colossal magneto resistance (CMR)-based magnetic materials, Heusler alloy-based magnetic materials, a magnetic semiconductor, and a combination thereof.

The spin wave device may further include a plurality of units including the spin wave-generating unit and the energy-supplying unit, wherein the units are connected to one another by the spin-wave waveguide so that the units can perform logic operations using wave factors of the spin wave as signals.

The present invention also provides a method of controlling wave factors of a spin wave that travels toward a nano-size spin-wave waveguide by changing magnetic intrinsic parameters and external characteristics of a magnetic material in a local area of the nano-size spin-wave waveguide, and a spin wave device for information processing to perform logic operations employing the method.

The present invention also provides a method of controlling the phases of spin waves by changing the phases of the spin waves by causing a change of an effective magnetic field locally in a spin-wave waveguide in which the spin waves travel. Here, the effective magnetic field is changed by one of an Oersted field, a stray field, elastic deformation, exchange coupling with other magnetic material, a current, and a spin torque.

ADVANTAGEOUS EFFECTS

In the method of generating spin waves according to the present invention, a dipole-exchange spin wave having an nm-scale wavelength, a high frequency of several tens of GHz, and a large amplitude can be locally generated in the area of a size of several tens of nm within a device. In addition, a spin wave device can be ultra-highly integrated and ultra-small sized by using the method. The spin wave device has the advantage of a very fast processing speed and can replace a CMOS-based information processing method.

BEST MODE

In an embodiment of the present invention, the spin wave device may further include a substrate supporting the spin wave-generating unit and the spin-wave waveguide, wherein the energy-supplying unit includes: a magnetic field-applying conducting wire formed at both sides of the substrate under the spin wave-generating unit; and a power unit applying a magnetic field to a portion of the spin wave-generating unit or the entire spin wave-generating unit by flowing a current through the magnetic field-applying conducting wire.

In another embodiment of the present invention, the energy-supplying unit may include: a laser light source; and a focusing lens focusing a beam of the laser light source on the spin wave-generating unit to heat the spin wave-generating unit.

In another embodiment of the present invention, the energy-supplying unit may include: a first conducting wire extending horizontally from a lower portion of the spin wave-generating unit; a second conducting wire extending horizontally from an upper portion of the spin wave-generating unit while forming a predetermined angle with the first conducting wire; and a power unit generating a spin wave by an action of a torque generated due to a current that is spin-polarized in the spin wave-generating unit by flowing a current through the first and second conducting wires. Here, the energy-supplying unit may further include a piezoelectric body being elastically deformed by a voltage flowing through the first and second conducting wires and supplying a magnetoelastic energy to the spin wave-generating unit.

In another embodiment of the present invention, the spin wave device may further include a plurality of units including the spin wave-generating unit and the energy-supplying unit, wherein the units may be connected to one another by the spin-wave waveguide. In this case, in order to improve the efficiency of spin wave transmission, a nonlinear portion of the spin-wave waveguide may be curve-shaped.

A waveguide formed of a different kind from or the same kind of magnetic material as a material used in forming the spin-wave waveguide may be inserted in the spin-wave waveguide. In this case, a frequency of a traveling spin wave may be selectively filtered by changing at least one of shape and dimension of the inserted waveguide and a magnetic material used in forming the waveguide. One selected from the group consisting of wavelength, amplitude and phase of the traveling spin waves, and a combination thereof may be changed by changing at least one of shape and dimension of the inserted waveguide and a magnetic material used in forming the waveguide.

In the spin wave device according to the present invention, the wave factors may include one wave factor selected from the group consisting of frequency, wavelength, amplitude and phase of the spin wave, and a combination thereof. In particular, logic operations may be performed by a change of the wave factors using a one or composite action of superposition, reflection, refraction, transmission, radiation, diffraction, and interference of the spin wave.

MODE OF INVENTION

Advantages and features of the present invention, and a method for achieving them will be clarified with reference to embodiments that will be described later. The invention may, however, be embodied in many different forms and should not be construed as being limited to the embodiments set forth herein; rather, these embodiments are provided so that this disclosure will be thorough and complete, and will fully convey the concept of the invention to those skilled in the art.

First Embodiment

FIG. 1 is a flowchart illustrating a method of generating spin waves according to an embodiment of the present invention.

Referring to FIG. 1, in the method of generating spin waves according to the present invention, an energy is supplied to a magnetic material in which magnetic vortex and magnetic antivortex spin structures exist separately or together (operation S1). Owing to the supply of the energy, spin waves are locally generated from a core of a magnetic vortex or magnetic antivortex spin structure (operation S2). In this case, spin waves can be locally generated from a core of the magnetic vortex or magnetic antivortex spin structure or while two vortexes collide with each other and annihilate, and simultaneously, electromagnetic waves having the same frequencies as those of the generated spin waves can be generated. A specific principle of generating the magnetic vortex, the magnetic antivortex spin structures and spin waves will be described later.

Like in the method of generating spin waves according to the present invention, when an energy is supplied to a magnetic material in which magnetic vortex and magnetic antivortex spin structures exist separately or together, a locally strong torque is generated in a core of the spin structures. A dipole-exchange spin wave having a large amplitude can be generated due to the torque. Since the size of the magnetic vortex or magnetic antivortex spin structure core is about 10-20 nm, according to the present invention, spin waves can be generated in the local area of a size of several tens of nm. The spin waves are dipole-exchange spin waves in which dipole and exchange interactions act dominantly. In addition, electromagnetic waves having the same frequencies as those of the generated spin waves can be generated.

Before operation S1 of the method of generating spin waves according to the present invention, the method may further include the operation of deciding shape and dimension of the magnetic material so that the magnetic vortex or magnetic antivortex structures exist separately or together. And, the kind of material, shape and dimension of the magnetic material or an energy-supplying manner and the amount of the supplied energy are adjusted so as to control wave factors, for example, frequency, wavelength, amplitude, and phase of spin waves and/or electromagnetic waves. When kinds of magnetic materials are changed, saturation magnetization, magnetic anisotropy constants, exchange coupling constants, and damping constants are changed so that wave factors of spin waves can be controlled. And, wave factors of spin waves can be controlled by using one of a magnetic field, an electric field, a voltage, a current, an electromagnetic wave, sound, heat, and a magnetoelastic energy or a combination thereof as an energy to be supplied to a magnetic material.

Figure 2:
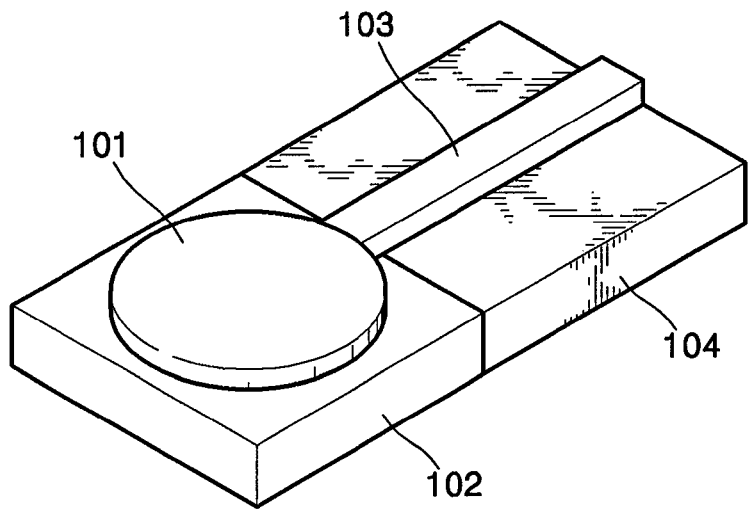
FIG. 2 illustrates an example of a core structure of a device for generating spin waves for implementing the method of generating spin waves illustrated in FIG. 1.

FIG. 2 illustrates an example of a spin wave device according to the present invention for implementing the method of generating spin waves illustrated in FIG. 1.

The spin wave device illustrated in FIG. 2 includes a spin wave-generating unit 101, an energy-supplying unit 102, and a spin-wave waveguide 103, which are supported by a substrate 104. The spin wave-generating unit 101 is a magnetic material, and an internal spin structure has shape and dimension in which magnetic vortex and magnetic antivortex spin structures may exist separately or together, which will be described later, and a locally strong torque is applied to a core of the spin structures. The spin wave-generating unit 101 may have a shape that will be described later. The energy-supplying unit 102 causes a strong torque by supplying an energy to the spin wave-generating unit 101. Spin waves generated from the core of the magnetic vortex or magnetic antivortex spin structure according to the supply of the energy are transmitted and propagated through the spin-wave waveguide 103. The spin wave-generating unit 101 and/or the spin-wave waveguide 103 may be all existing magnetic materials. For example, the spin wave-generating unit 101 and/or the spin-wave waveguide 103 may be one magnetic materials selected from the group consisting of ferromagnetic materials, antiferromagnetic materials, ferrimagnetic materials, alloy-based magnetic materials, oxide-based magnetic materials, colossal magneto resistance (CMR)-based magnetic materials (for example, peroveskite, manganese oxide $La_{1-x}A_xMnO_3$ (A=Sr, Ba, Ca) and $Nd_{0.5}Pb_{0.5}MnO_3$)), Heusler alloy-based magnetic materials (about 50% of Cu, 25% of Mn, and 25% of Sn, where Sn may be substituted for Al, As, Sb, Bi, and B and Cu may be substituted for Ag), a magnetic semiconductor, and a combination structure thereof.

(Principle in which Magnetic Vortex, Magnetic Antivortex Spin Structures and Spin Waves are Generated)

A specific principle in which magnetic vortex, magnetic antivortex spin structures and spin waves are generated will now be described.

The distribution of spin directions in a thin film formed of a magnetic material is decided by several energies and primarily by a magnetostatic energy, an exchange energy, and an anisotropy energy. Magnetic vortexes which can be primarily observed in a patterned ferromagnetic thin film having a diameter of several hundreds of nm to several μm is a magnetic microstructure in equilibrium decided by these energies.

Most spins in the patterned ferromagnetic thin film direct toward a direction that is parallel to a thin film surface by a shape anisotropy energy. In addition, when, due to an exchange energy acting in a near distance, adjacent spins tend to direct toward the same direction but the spins direct toward the same direction in a magnetic material of a definite size, a free pole is generated in an end portion of the magnetic material and a magnetostatic energy increases so that the spins have the shape of magnetic vortex that follows one after another, so as to reduce the magnetostatic energy.

Figure 3A:
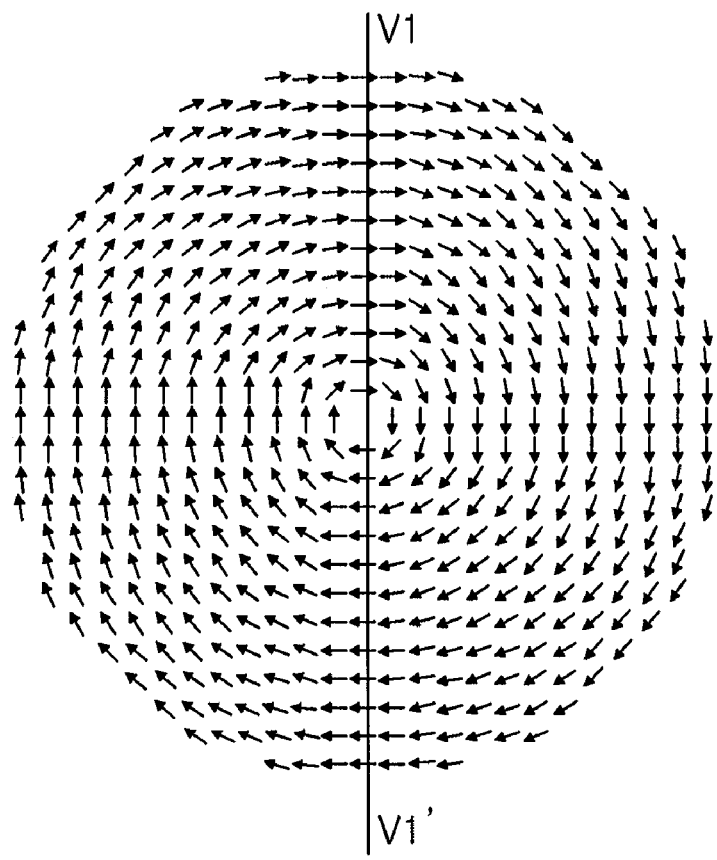
FIG. 3A illustrates the in-plane directions of spins in a magnetic vortex spin structure.
Figure 3B:
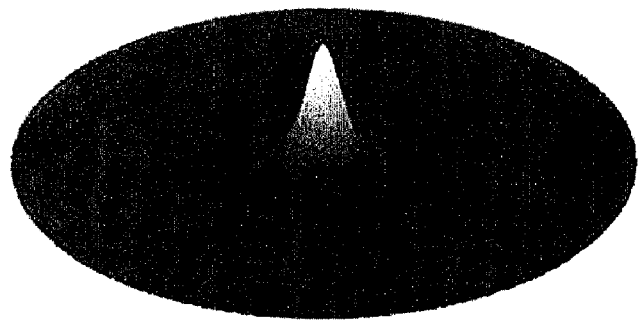
FIG. 3B illustrates out-of-plane direction components of the spins in the magnetic vortex spin structure of FIG. 3A.
Figure 3C:
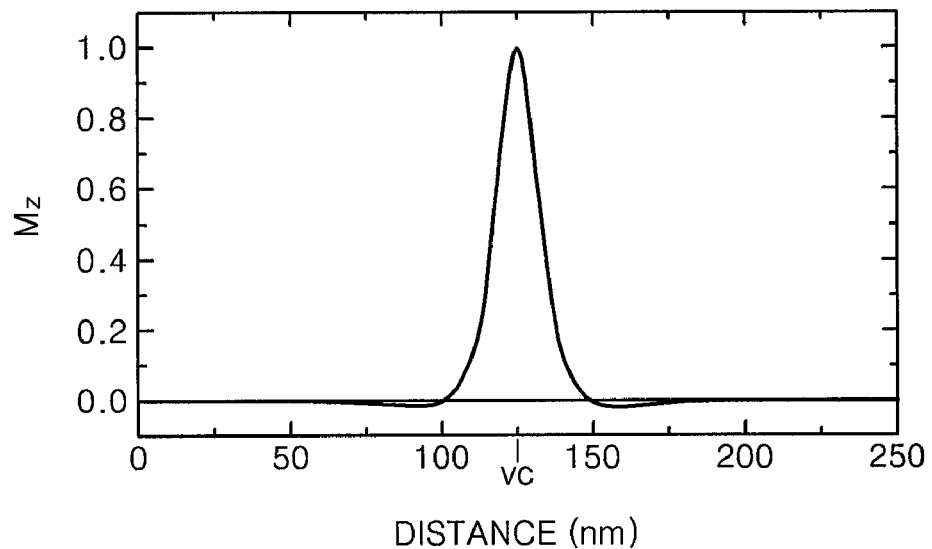
FIG. 3C is a graph of distance versus magnitude of out-of-plane component of the spins in line V1-V1' in the magnetic vortex spin structure of FIG. 3A.

The results of simulation related to such a magnetic vortex structure is presented in FIGS. 3A through 3C. In FIGS. 3A through 3C, a stabilized shape of a circular permalloy magnetic thin film having a diameter of 250 nm and a thickness of 20 nm is obtained by using micromagnetic simulation. FIG. 3A illustrates directions of spins on an xy plane indicated by arrows when directions on a thin film surface are x and y directions and a direction perpendicular to a thin film surface is a z direction. FIG. 3B illustrates vertical direction components of spins on the xy plane, that is, the distribution of $M_z$ values, according to the height of a surface and the contrast of black and white. In this case, the magnetization direction of a vortex core may direct upwards or downwards. FIG. 3C illustrates the ratio of a z direction component of spins located in line V1-V1' to saturation magnetization, and a vortex core vc can be verified in FIG. 3C.

Figure 4A:
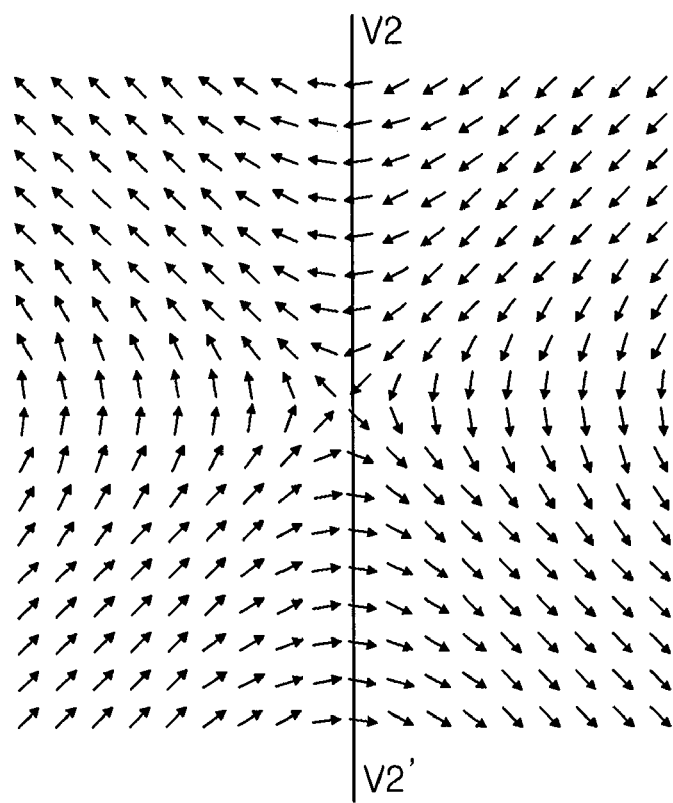
FIG. 4A illustrates the in-plane direction of the spins in a magnetic antivortex spin structure.
Figure 4B:
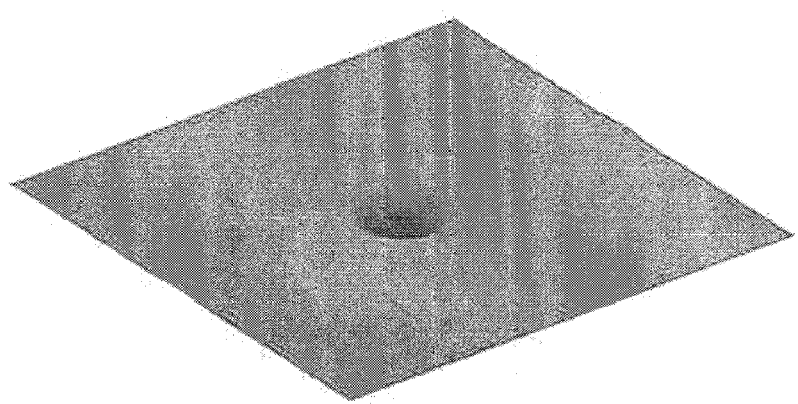
FIG. 4B illustrates out-of-plane direction components of the spins in the magnetic antivortex spin structure of FIG. 4A.
Figure 4C:
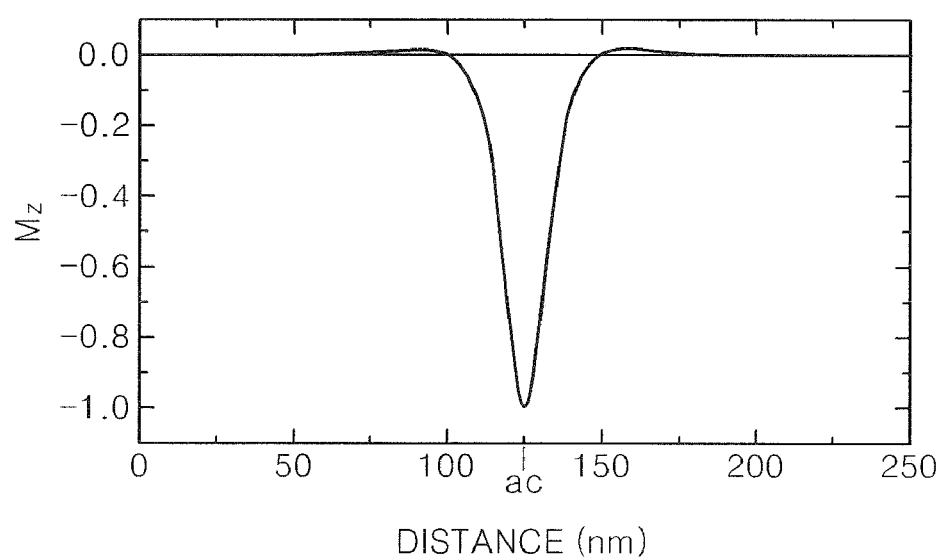
FIG. 4C is a graph of distance versus magnitude of out-of-plane component in line V2-V2' of the spins in the magnetic antivortex spin structure of FIG. 4A.

In addition, there is a magnetic antivortex spin structure having an opposite structure to the magnetic vortex structure. The structure has a shape in which directions of spins are parallel to a thin film surface and adjacent spins follow one after another, so as to reduce a magnetostatic energy, like in the magnetic vortex spin structure. However, this is not a magnetic vortex structure but a cross-block line shape of FIG. 4A. FIGS. 4A through 4C illustrate a portion in which a magnetic antivortex is formed, of the result in which a stabilized shape of a peanut-shaped permalloy magnetic thin film is obtained by using micromagnetic simulation. FIG. 4A illustrates directions of spins on an xy plane indicated by arrows. FIG. 4B illustrates vertical direction components of spins on the xy plane, that is, the distribution of $M_z$ values, according to the height of a surface and the contrast of black and white. In this case, the magnetization direction of a magnetic antivortex core may direct upwards or downwards. FIG. 4C illustrates the ratio of a z direction component of spins located in line V2-V2' to saturation magnetization. It can be verified in FIG. 4C that the magnetic antivortex spin structure also has an antivortex core ac directing toward a direction perpendicular to a thin film surface.

When an energy such as a magnetic field is generally applied to a magnetic material, a torque is generated and individual spins start a precessional motion. When an energy is applied to the above-described magnetic vortex or magnetic antivortex spin structure, a torque is also generated. In this case, the present inventors have found that, even though an energy is uniformly applied to the entire magnetic material, a very large torque is generated in magnetic vortex and magnetic antivortex cores unlike circumferences thereof, and the present inventors have found that a rapid change of a core spin direction perpendicular to a thin film surface or the movement of magnetic vortex and magnetic antivortex spin structures is generated and spin waves having a large amplitude are generated from a core which is a local area and are radiated. Wave factors such as frequency, wavelength, amplitude, and phase of spin waves generated in this case are decided according to inherent characteristics such as saturation magnetization of a magnetic material having a magnetic vortex or magnetic antivortex spin structure, magnetic anisotropy constants, exchange coupling constants, damping constants, shape and dimension of the magnetic material, and according to an energy-supplying manner.

Figure 5A:
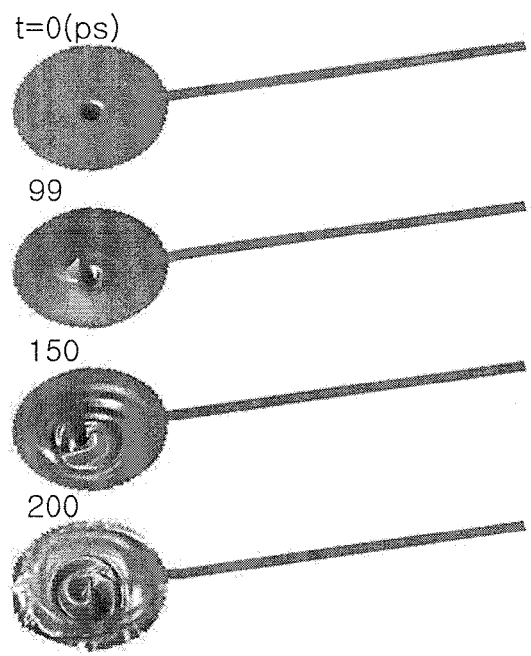
FIG. 5A illustrates the micromagnetic simulation results of a core structure of the spin wave device illustrated in FIG. 2.
Figure 5B:
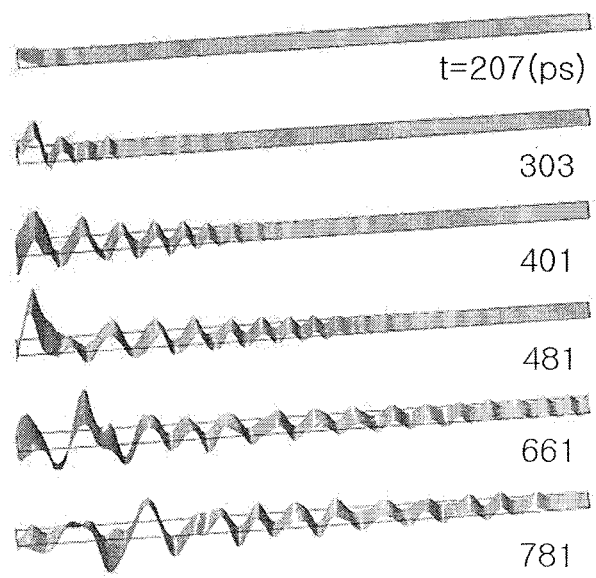
FIG. 5B illustrates the result of a spin-wave waveguide among the results of FIG. 5A, which illustrates out-of-plane components of the magnetization directions according to time.

FIG. 5A illustrates the micromagnetic simulation result of the spin wave device illustrated in FIG. 2, and FIG. 5B illustrates the result of a spin-wave waveguide among the results of FIG. 5A, which illustrates the magnetization directions of vertical components according to time. Here, the spin wave-generating unit 101 is a permalloy magnetic thin film of a circular disc in which a magnetic vortex spin structure exists separately.

FIG. 5A illustrates spin waves generated by applying a sine wave-shaped pulse magnetic field to the spin wave-generating unit 101 and by causing a rapid change in the direction of a magnetic vortex core, according to time. It can be verified that strong spin waves are radiated from the magnetic vortex core within a circular disc according to time. FIG. 5B illustrates that spin waves generated in the spin wave-generating unit 101 are propagated through the spin-wave waveguide 103 according to time.

Figure 6:
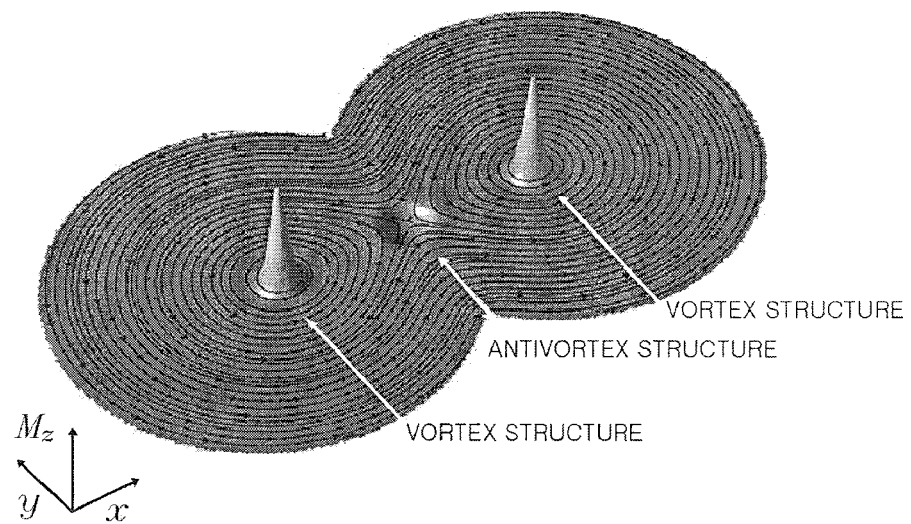
FIG. 6 illustrates the simulation results showing a microstructure in which one magnetic antivortex spin structure exists in a stable state between two magnetic vortexes in a peanut-shaped magnetic thin film structure.

FIG. 6 illustrates an example in which magnetic vortex and magnetic antivortex structures exist together in the spin wave-generating unit 101 and in which a stabilized shape of a peanut-shaped permalloy magnetic thin film is obtained by using the result of micromagnetic simulation. Solid lines and small arrows of FIG. 6 represent the spatial distribution of spin directions parallel to a plane and the height of a surface and contrast mean vertical direction components of spins, that is, the spatial distribution of $M_z$ values. When an energy is applied to the spin wave-generating unit 101 formed of a magnetic material in which the magnetic vortex and magnetic antivortex spin structures exist together, the two spin structures move, as described with reference to FIGS. 7A through 7E and finally meet each other and annihilate. The instant that the two spin structures annihilate, a large torque is generated in a local area in which cores of the two spin structures meet each other so that spin waves having a large amplitude are generated and are radiated. Wave factors such as frequency, wavelength, amplitude, and phase of spin waves generated in this case are decided according to inherent characteristics such as saturation magnetization of a magnetic material having a magnetic vortex or magnetic antivortex spin structure, magnetic anisotropy constants, exchange coupling constants, damping constants, shape and dimension of the magnetic material, and according to an energy-supplying manner.

FIGS. 7A through 7E illustrate micromagnetic simulation results performed by the present inventors using a permalloy magnetic thin film as a model with respect to the generation of spin waves due to movement and annihilation according to time of the above-described magnetic vortex/magnetic antivortex spin structures. In FIGS. 7A through 7E, the height of a surface and contrast mean the spatial distribution of spin direction components perpendicular to a plane, like in FIG. 6.

Figure 7A:
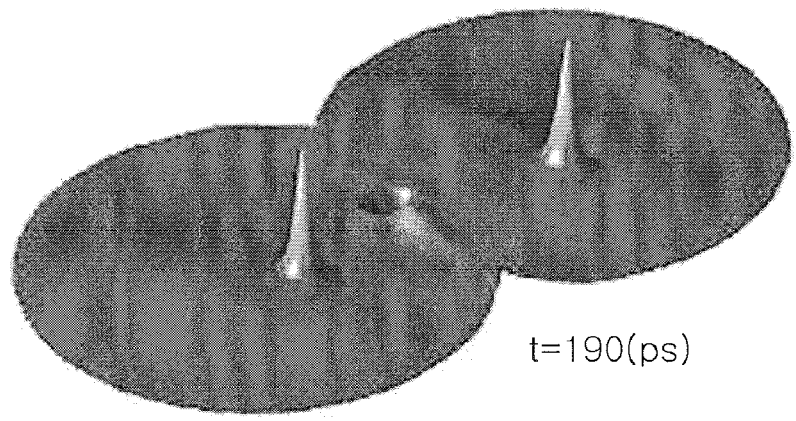
FIGS. 7A, 7B, 7C, and 7D illustrate the states where the spatial distribution of vertical direction components of spins is changed according to time when a magnetic field is applied to the magnetic vortex/magnetic antivortex spin structure illustrated in FIG. 6.
Figure 7B:
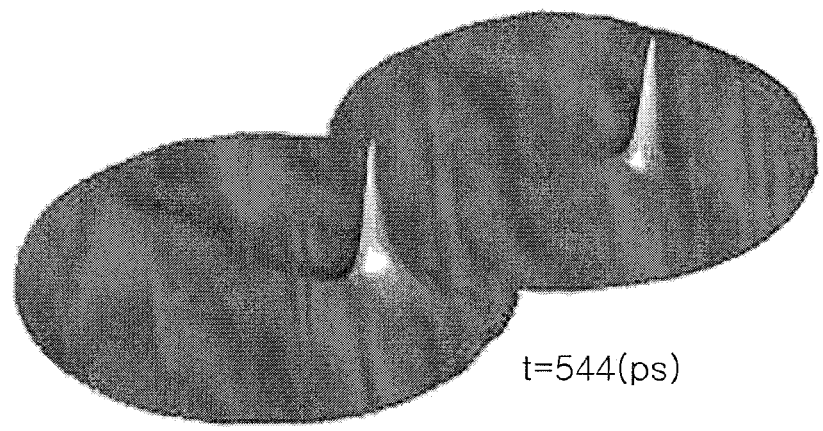
Figure 7C:
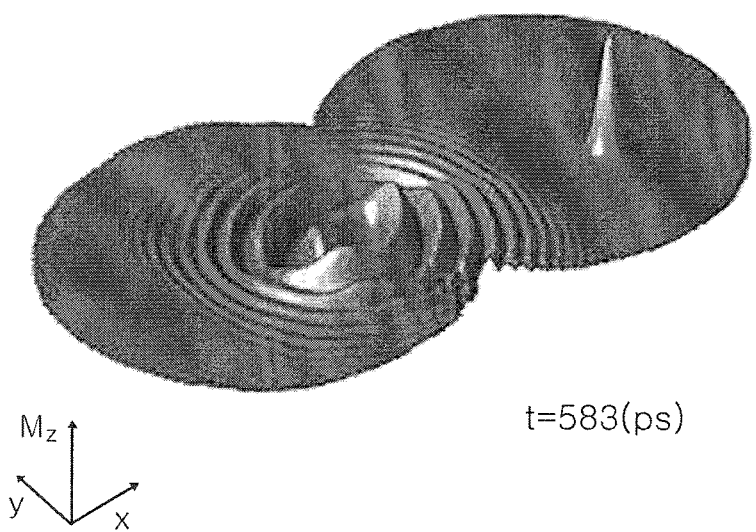
Figure 7D:
Figure 7E:
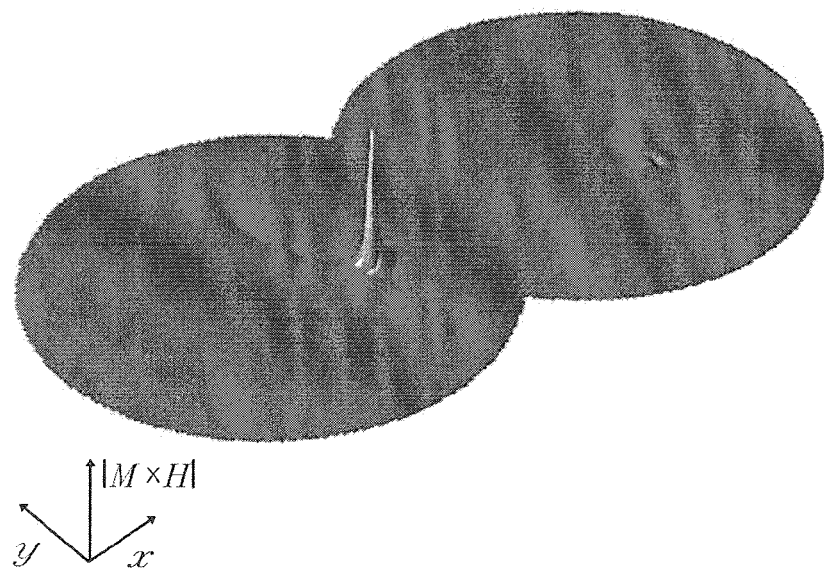
FIG. 7E illustrates the spatial distribution of torque values generated in a vortex core in the instant that the magnetic vortex/magnetic antivortex spin structure annihilates.

FIG. 7A illustrates spin waves generated due to movement of a magnetic vortex spin structure when a magnetic field is applied and time of 190 ps elapses. FIG. 7B illustrates the spatial distribution of spin direction of the instant that magnetic vortex and magnetic antivortex spin structures meet each other and annihilate after time of 544 ps elapses. FIGS. 7C and 7D illustrate spin waves generated after the magnetic vortex and magnetic antivortex spin structures annihilate and show spatial distribution after time of 583 ps and 654 ps, respectively, elapses. FIG. 7E illustrates the spatial distribution of a torque size of the annihilation instant illustrated in FIG. 7B and shows that a strong torque is formed in a local portion in which magnetic vortex and magnetic antivortex spin structures meet each other.

Figure 8A:
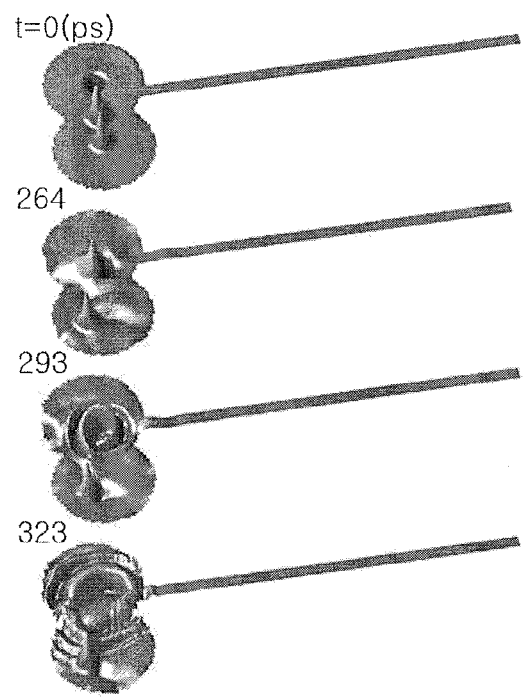
FIG. 8A illustrates the simulation results of the device for generating spin waves in which the magnetic vortex and magnetic antivortex spin structures exist together, like in FIG. 6.
Figure 8B:
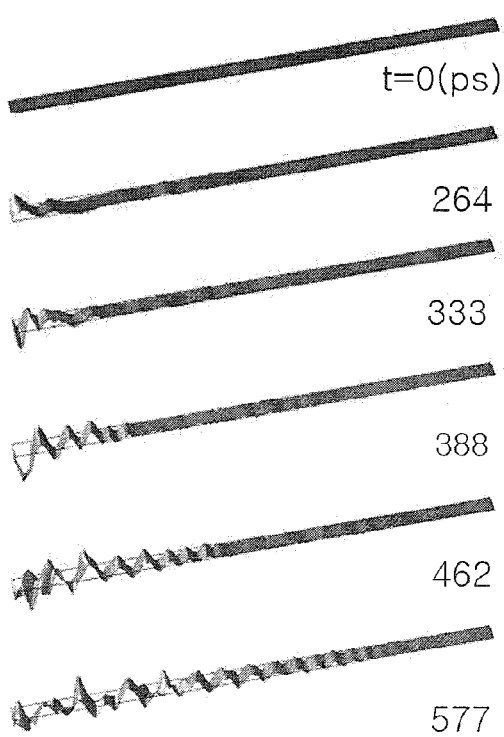
FIG. 8B illustrates the result of a spin-wave waveguide among the results of 8A.

FIG. 8A illustrates the simulation result of a spin wave device including a spin wave-generating unit in which magnetic vortex and magnetic antivortex spin structure exist together, and FIG. 8B illustrates the result of a spin-wave waveguide among the results of FIG. 8A.

FIG. 8A illustrates spin waves generated by applying a static magnetic field having a predetermined size to the spin wave-generating unit 101 having a magnetic vortex spin structure and, by causing movement of magnetic vortex and magnetic antivortex spin structures and by annihilating the two structures, according to time. FIG. 8B illustrates that spin waves generated in the spin wave-generating unit 101 are propagated through the spin-wave waveguide 103 according to time.

A detailed description of respective elements of the spin wave device and exemplary embodiments thereof will now be described.

Second Embodiment

In the spin wave device illustrated in FIG. 2, the spin wave-generating unit 101 has a circular thin film shape. However, the shape of the spin wave-generating unit 101 in the spin wave device according to the present invention is not limited to this. Only, when the shape and dimension of the spin wave-generating unit 101 are decided, the above-described magnetic vortex and magnetic antivortex spin structures should exist separately or together in a stable state.

Figure 9:
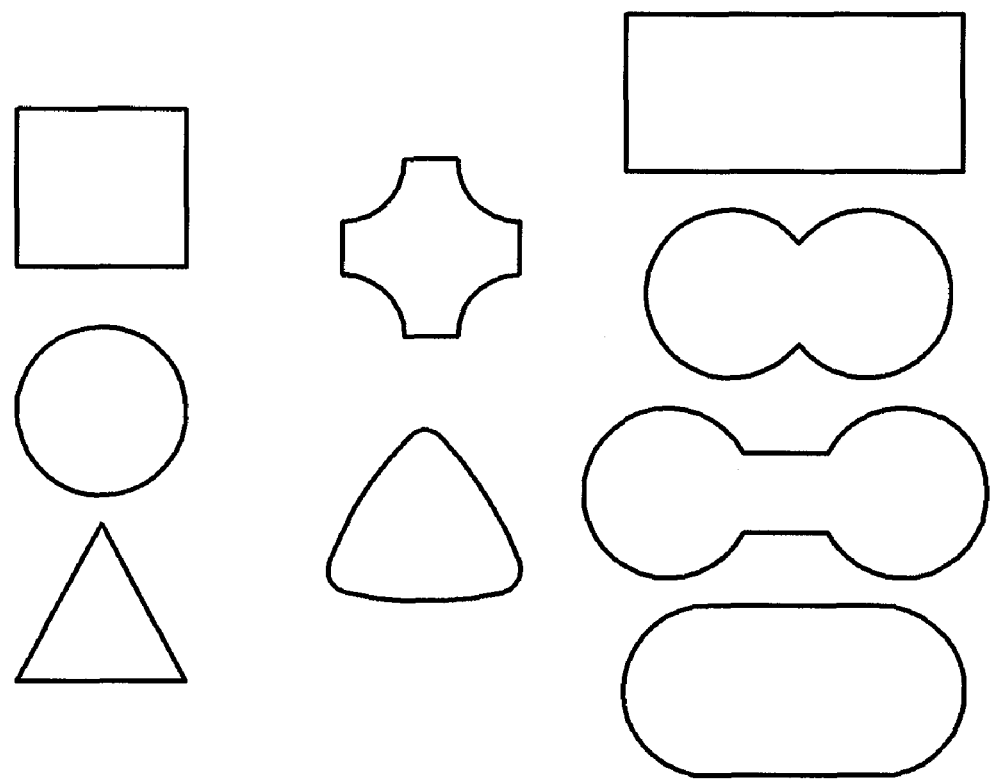
FIG. 9 illustrates a thin film structure in which a magnetic vortex exists separately or together with a magnetic antivortex in a stable state and illustrates examples of shapes of spin wave-generating units.

FIG. 9 illustrates possible shapes as the shape of a spin wave-generating unit in the spin wave device according to the present invention. As illustrated in FIG. 9, examples of shapes of the spin wave-generating unit may include a rectangular shape, a circular shape, a triangular shape, a rectangular shape having circular arc-shaped edges, a triangular shape having rounded edges, a quadrangular shape, a peanut shape, a dumbbell shape, and a rectangular shape having circular arc-shaped extended left and right sides.

Third Embodiment

The energy-supplying unit 102 supplies an energy to the spin wave-generating unit 101. Here, one of a magnetic field, an electric field, a voltage, a current, an electromagnetic wave, sound, heat, and a magnetoelastic energy acts on the spin wave-generating unit 101 separately or compositely and causes the formation of a local torque. The energy-supplying unit 102 may have various shapes and materials according to kinds of applied energies.

Figure 10A:
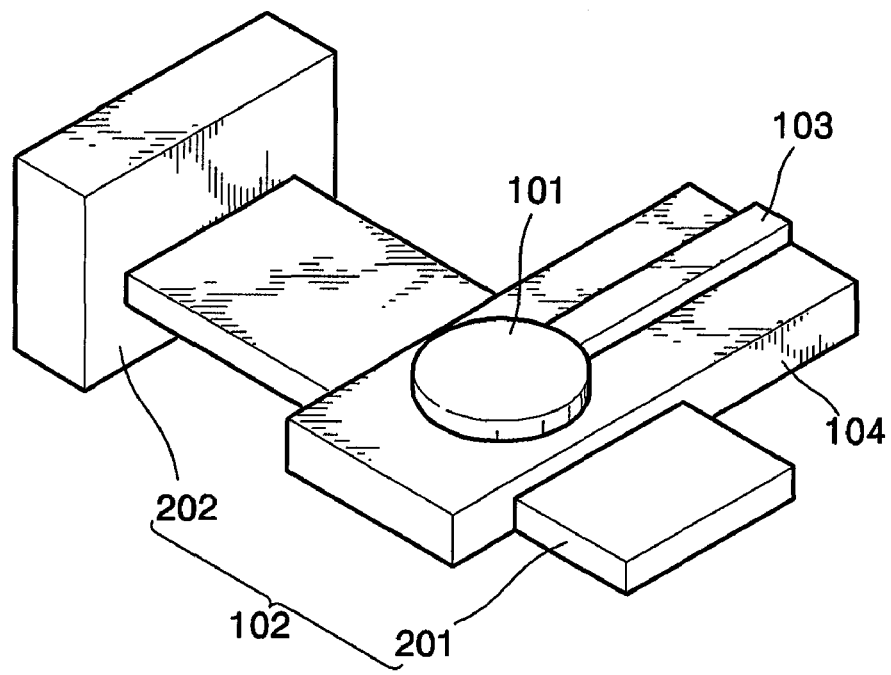
FIG. 10A illustrates core portions of a device for generating spin waves by supplying a magnetic field energy according to an embodiment of the present invention.

FIG. 10A illustrates an embodiment of the case where the energy-supplying unit 102 supplies a magnetic field energy. Here, the spin wave-generating unit 101 and the spin-wave waveguide 103 are supported on the substrate 104. Specifically, the energy-supplying unit 102 includes a magnetic field-applying conducting wire 201 formed of metallic wires at both sides of the substrate 104 under the spin wave-generating unit 101, and a power supply unit 202. Here, a magnetic field is applied to a portion or the entire surface of the spin wave-generating unit 101 by flowing a current through the magnetic field-applying conducting wire 201 using the power supply unit 202.

Figure 10B:
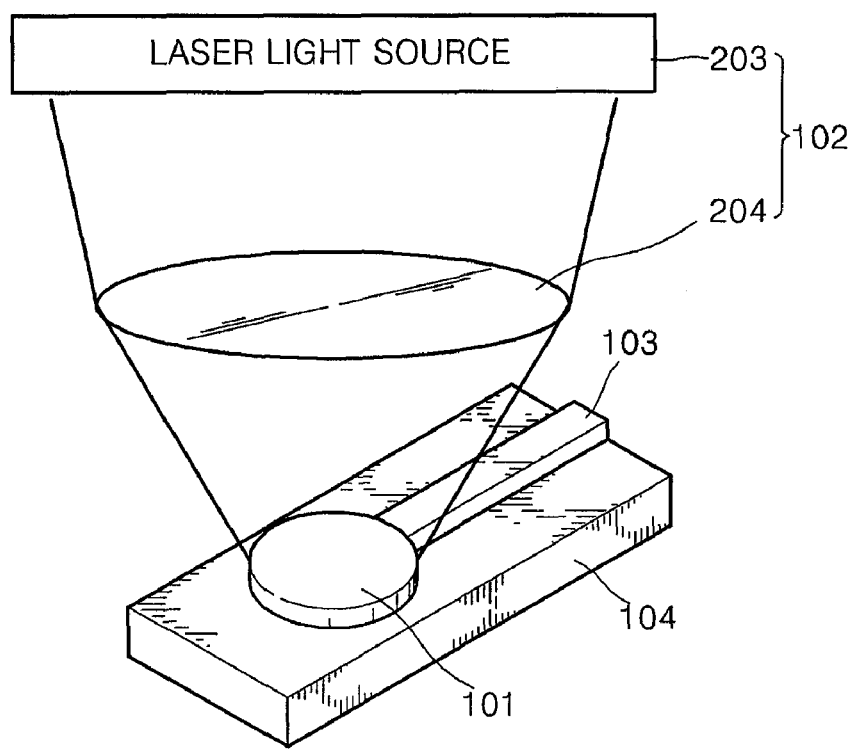
FIG. 10B illustrates core portions of a device for generating spin waves by supplying a thermal energy through laser light incidence according to an embodiment of the present invention.

FIG. 10B illustrates an embodiment of the case where the energy-supplying unit 102 supplies a thermal energy. The energy-supplying unit 102 includes a laser light source 203 and a focusing lens 204. Here, beams emitted from the laser light source 203 are focused on the spin wave-generating unit 101 using the focusing lens 204 so that heat can be applied to the spin wave-generating unit 101.

Figure 10C:
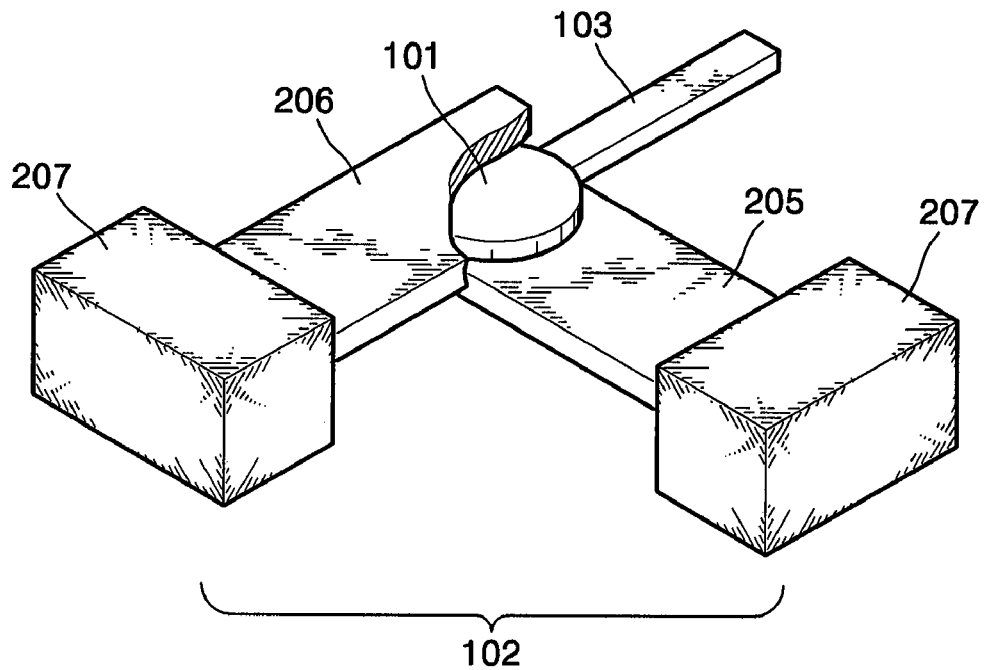
FIG. 10C illustrates core portions of a device for generating spin waves by generating a spin torque in a vortex core due to a current according to an embodiment of the present invention.

FIG. 10C illustrates a spin wave device having the energy-supplying unit 102 using an energy or a torque due to a spin torque of spin-polarized electrons. The energy-supplying unit 102 includes a first conducting wire 205 that extends horizontally from a lower portion of the spin wave-generating unit 101, a second conducting wire 206 that extends horizontally from an upper portion of the spin wave-generating unit 101 while forming a predetermined angle with the first conducting wire 205, and a power supply unit 207. Here, an energy generated caused by a torque action due to a spin-polarized current is applied to the spin wave-generating unit 101 by flowing a current through the first and second conducting wires 205 and 206 using the power supply unit 207. Although two power supply units 207 are connected to the first and second conducting wires 205 and 206, respectively, it is obvious to one of ordinary skill in the art that the configuration of the power supply unit 207 may be changed in various shapes.

Figure 10D:
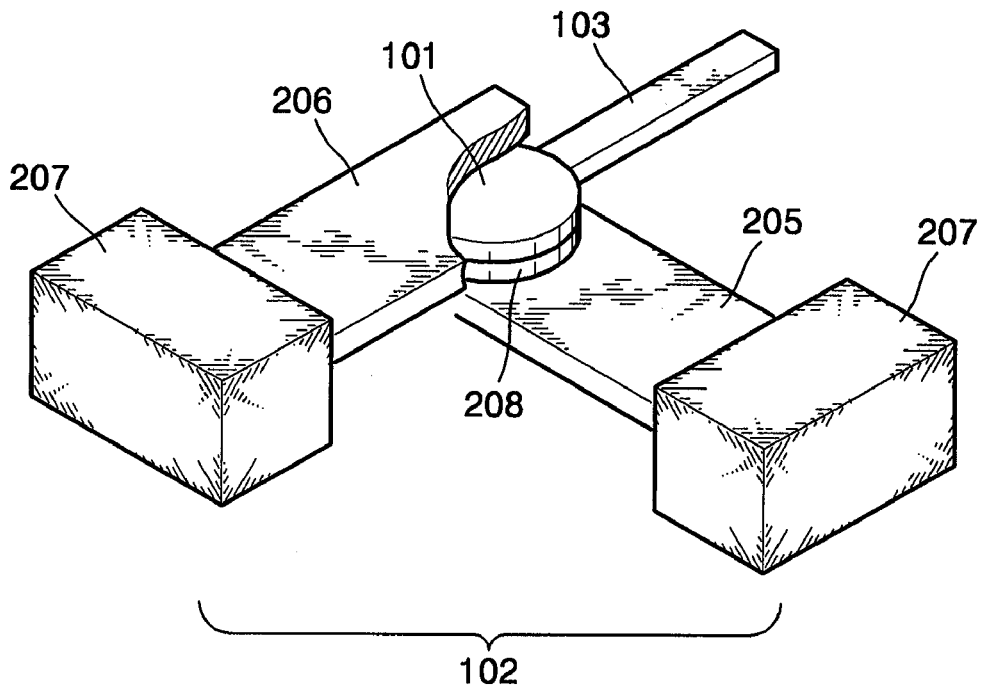
FIG. 10D illustrates core portions of a device for generating spin waves by using an elastic energy according to an embodiment of the present invention.

FIG. 10D illustrates a spin wave device having the energy-supplying unit 102 for applying a magnetoelastic energy. Referring to FIG. 10D, the energy-supplying unit 102 further includes a piezoelectric body 208 in the structure of FIG. 10C, and the piezoelectric body 208 is joined to a lower portion of the spin wave-generating unit 101. When a voltage is applied to the piezoelectric body 208 by flowing a current through the first and second conducting wires 205 and 206 using the power supply unit 207, elastic deformation occurs in the piezoelectric body 208, and a magnetoelastic energy is supplied to the spin wave-generating unit 101 by elastic deformation.

Besides, the energy-supplying unit 102 can be constructed to supply an energy such as an electric field, a voltage, a current, an electromagnetic wave, and sound, to the spin wave-generating unit 101. It is obvious to one of ordinary skill in the art that the detailed configuration of the energy-supplying unit 102 may be easily implemented and changed and therefore, a detailed description thereof will be omitted.

Fourth Embodiment

Figure 11:
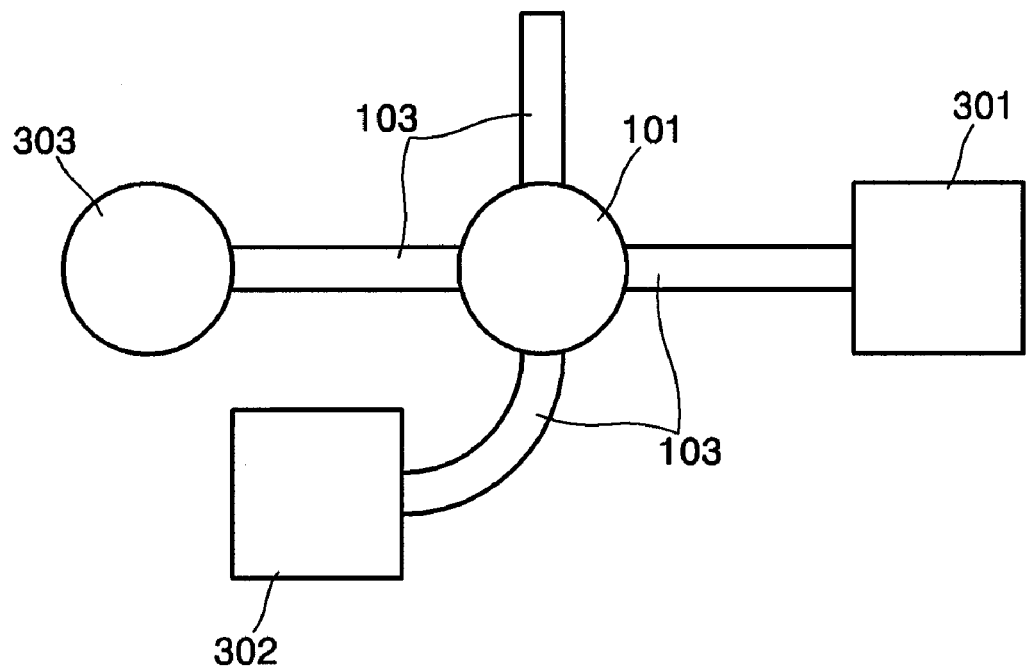
FIG. 11 illustrates another example of a spin wave device according to an embodiment of the present invention.

The spin-wave waveguide 103 serves as a medium for spatially transmitting spin waves generated in the spin wave-generating unit 101. When one end of one or several spin wave guides 103 are connected to the spin wave-generating unit 101 and the other end thereof is connected to other spin wave device, spin waves generated in the spin wave-generating unit 101 can be transmitted to other spin wave device. FIG. 11 illustrates an example of a spin wave device according to the present embodiment.

The spin wave device illustrated in FIG. 11 includes a plurality of units having a spin wave-generating unit and an energy-supplying unit. Examples of the plurality of units include a first unit 301 having a square-shaped spin wave-generating unit, a second unit 302 having other square-shaped spin wave-generating unit, and a third unit 303 having a circular-shaped spin wave-generating unit. The first through third units 301, 302, and 303 are connected to one another by the spin-wave waveguide 103. For example, spin waves generated in the spin wave-generating unit 101 are transmitted to the first unit 301 by the spin-wave waveguide 103 between the spin wave-generating unit 101 and the first unit 301. In order to improve the efficiency of spin wave transmission, a portion of the spin-wave waveguide 103 may be formed in several shapes such as curve.

(Spin Wave Device as Ultra-High Speed Information Processing Device)

Since the speed of spin waves generated using the method of generating spin waves according to the present invention is very fast, the speed of information processing becomes very fast when a plurality of units including a spin wave-generating unit and an energy-supplying unit are connected to one another by a spin-wave waveguide and are implemented as an information processing device, as described with reference to FIG. 11. Accordingly, a spin wave device may be suitable for a device for ultra-high speed information processing. In this case, the respective units are connected to perform logic operations using wave factors of spin waves as signals, and connection relations thereof are properly changed so that logic operation means such as an OR gate, an XOR gate, a NOR gate, an AND gate, a NAND gate, an inverter, and a combination thereof can be implemented. The wave factors may be one of the wave factor selected from the group consisting of frequency, wavelength, amplitude and phase of spin waves, and a combination thereof, and logic operations are performed by a change of the wave factors using any one or composite action of superposition, reflection, refraction, transmission, radiation, diffraction, and interference of the spin waves.

Firstly, wave characteristics of spin waves will be described. FIGS. 12A through 12D and FIGS. 13A through 13E illustrate micromagnetic simulation results performed by the present inventors using a magnetic thin film as a model, so as to investigate wave characteristics of spin waves generated by the method according to the present invention.

Firstly, propagation, reflection, and transmission characteristics of spin waves will be described with reference to embodiments of FIGS. 12A through 12D. A simulation method thereof is as follows.

Figure 12A:
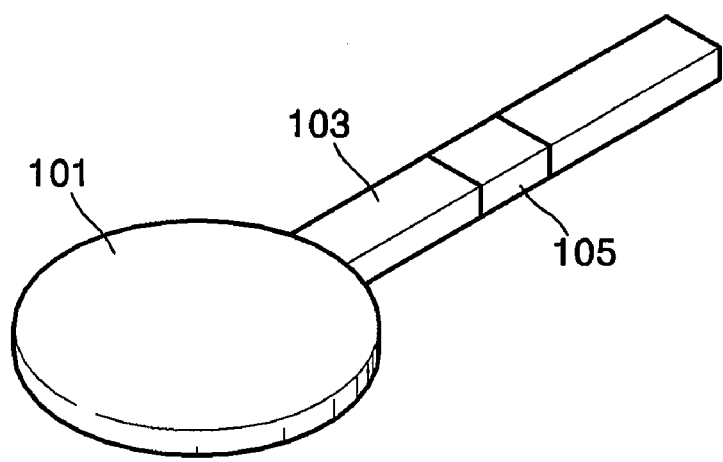
FIG. 12A illustrates an example in which a waveguide formed of a different kind of magnetic material is inserted in a spin-wave waveguide.

As illustrated in FIG. 12A, spin waves are generated from a spin wave-generating unit 101 formed of permalloy on the left side, and the spin waves generated in the spin wave-generating unit 101 are injected into the spin-wave waveguide 103 formed of permalloy. In this case, when a waveguide 105 formed of Fe is inserted in the spin-wave waveguide 103 formed of permalloy, the Fe waveguide 105 is formed of a different magnetic material from permalloy and thus has different magnetic intrinsic parameters (saturation magnetization, magnetic anisotropy constants, exchange coupling constants, and damping constant) from those of permalloy. As such, a different energy barrier from the permalloy spin-wave waveguide 103 is formed, and reflection, transmission, and tunneling of the spin waves occur by the energy barrier. Accordingly, the frequencies of the traveling spin waves can be selectively filtered or any one of wavelength, amplitude and phase of the traveling spin waves, and a combination thereof can be changed.

Figure 12B:
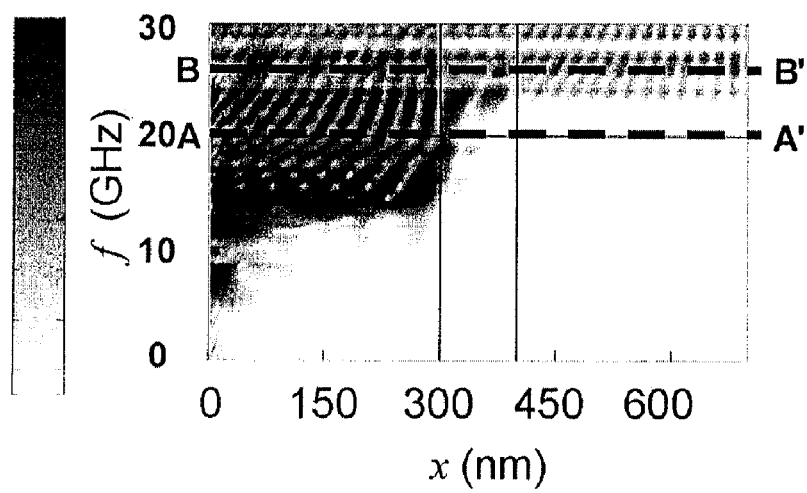
FIG. 12B illustrates reflection, transmission, and tunneling of a spin wave according to frequencies when a waveguide formed of a different kind of magnetic material is inserted.

FIG. 12B illustrates reflection, transmission, and tunneling of spin waves according to frequencies when a waveguide formed of a different kind of magnetic material is inserted.

Referring to FIG. 12B, y-axis is frequency, and x-axis is a distance x from a center of the spin wave-generating unit 101. Spin waves having frequencies of 14 GHz and above may exist inside the permalloy spin-wave waveguide 103. However, when the Fe waveguide 105 is inserted in an area (x=300~400 nm), spin waves having frequencies below 25 GHz do not enter into the Fe waveguide 105 and are reflected when spin waves are incident into the Fe waveguide 105, and spin waves having frequencies above 25 GHz transmit the Fe waveguide 105 and are propagated thereinto.

Figure 12C:
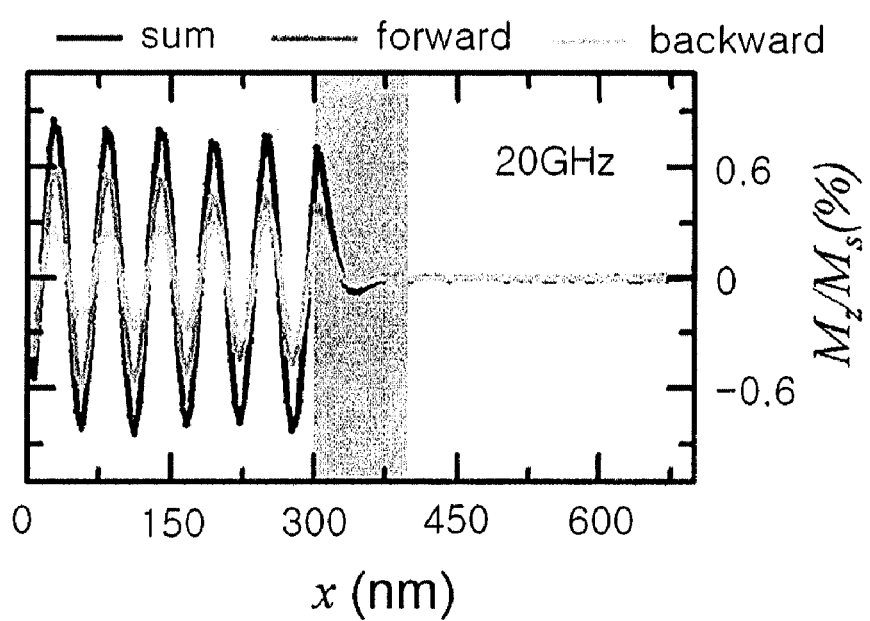
FIG. 12C illustrates transmission, reflection, and tunneling of the spin wave having a frequency of 20 GHz (A-A') in FIG. 12B.
Figure 12D:
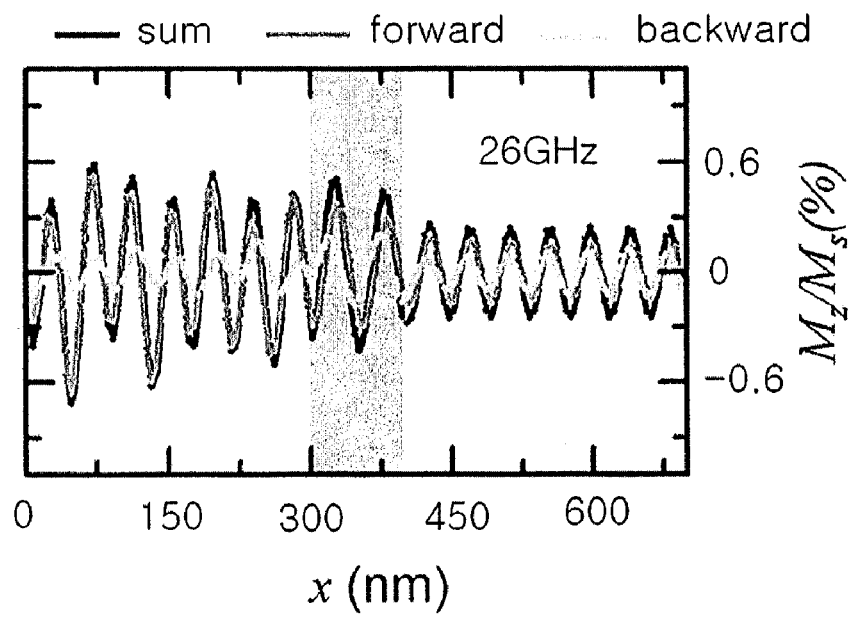
FIG. 12D illustrates transmission, reflection, and tunneling of the spin wave having a frequency of 26 GHz (B-B') in FIG. 12B.

FIGS. 12C and 12D illustrate the distribution of spin waves each having a frequency of 20 GHz (A-A') and 26 GHz (B-B') along their propagation directions when time is 1 ns. Referring to FIG. 12C, spin waves of 20 GHz that propagates forwardly from an inside of the permalloy spin-wave waveguide 103 meet the Fe waveguide 105 and the amplitude of the spin waves is attenuated, the spin waves do not travel any longer and are reflected backwards. However, referring to FIG. 12D, it can be observed that spin waves of 26 GHz meet the Fe waveguide 105 and a portion thereof is reflected and a portion thereof is penetrated. A frequency filtering action as illustrated in FIG. 12B can be performed on a waveguide formed of a different kind of magnetic material coupling as illustrated in FIG. 12A, and the waveguide can be used for a spin wave filter by using the frequency filtering action.

FIGS. 13A through 13E illustrate micromagnetic simulation results performed by the present inventors using a magnetic thin film as a model, so as to investigate interference characteristics of spin waves using propagation, reflection, and transmission of the above-described spin waves.

Figure 13A:
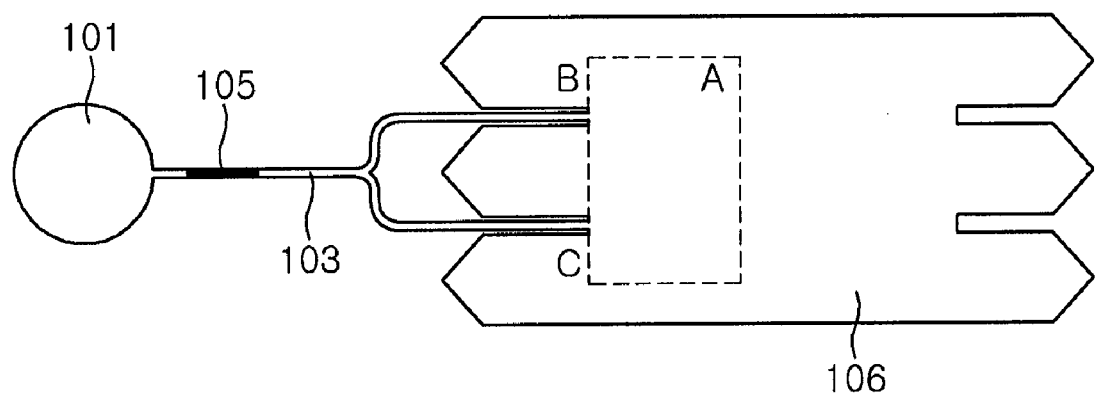
FIG. 13A illustrates a model structure showing a wave nature of radiation, transmission, reflection, tunneling, filtering, and interference of a spin wave.

As illustrated in FIG. 13A, spin waves are formed from the spin wave-generating unit 101 formed of permalloy on the left side, and an Y-shaped symmetrical permalloy spin-wave waveguide 103 is formed to have the same phase and to be transmitted to positions B and C. The spin-wave waveguide 103 is formed in a curve shape, as described previously, to increase transmission efficiency, and the Fe waveguide 105 other than permalloy is inserted to filter spin waves having a frequency band of less than a predetermined area.

Figure 13B:
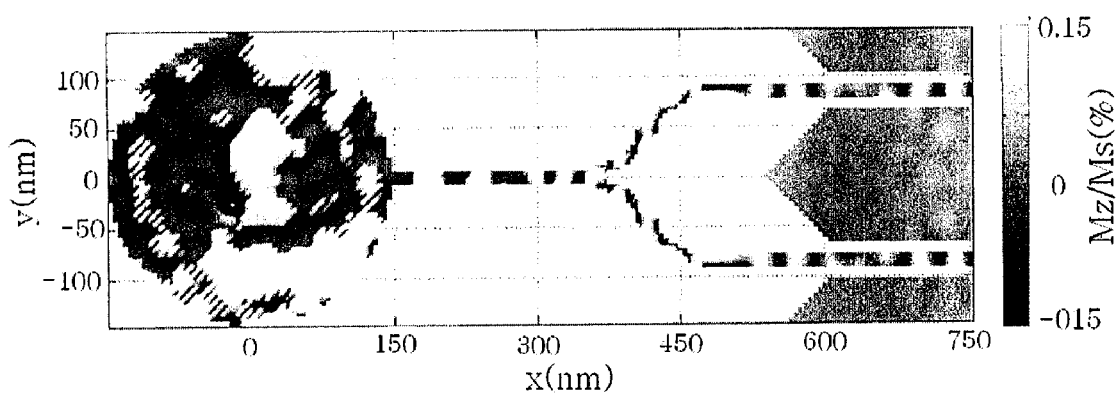
FIG. 13B illustrates the propagation of a spin wave on a Y-shaped spin waveguide when time is 1.0 ns.
Figure 13C:
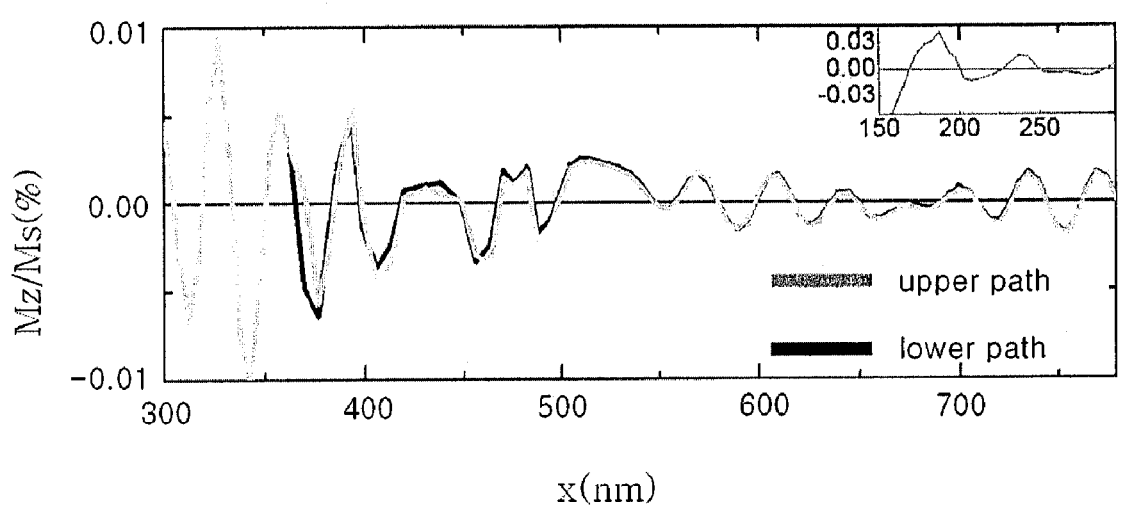
FIG. 13C illustrates coherency of a spin wave on both sides of the Y-shaped spin-wave waveguide when time is 1.0 ns.

When the spin waves having the same characteristics in this way reach positions B and C (an upper path and a lower path) in a coherent state, as illustrated in FIGS. 13B and 13C, the spin waves having the same wave factors are radiated to a right large permalloy ferromagnetic thin film 106 at positions B and C. This is the same experiment as a double slit experiment of Young that has been carried out to prove a wave nature of light and is the simulation result showing a wave nature of spin waves.

Figure 13D:
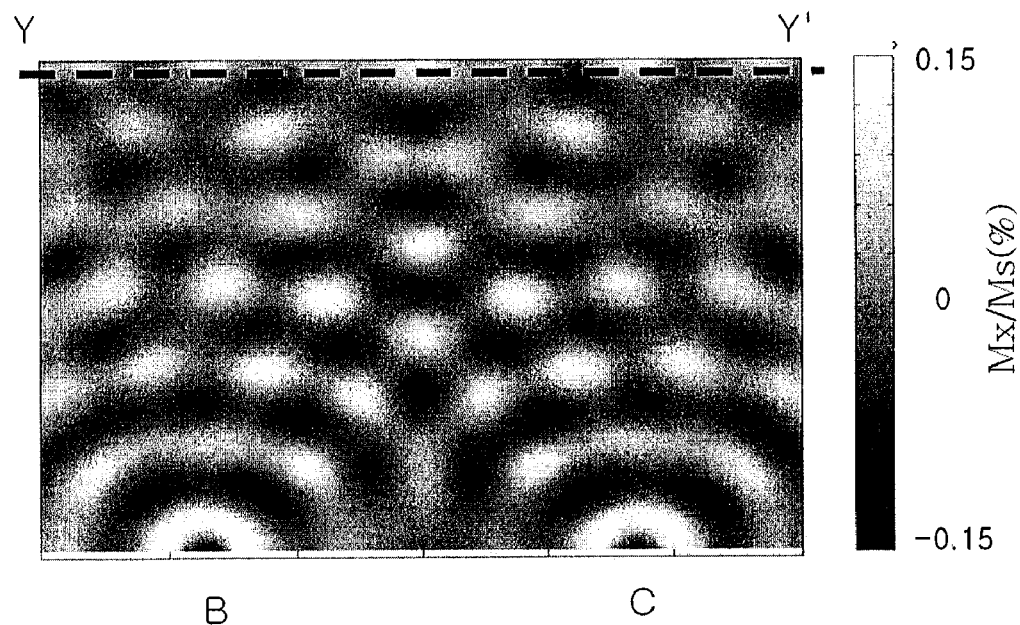
FIG. 13D illustrates an interference pattern of a spin wave at position A illustrated in FIG. 13A.
Figure 13E:
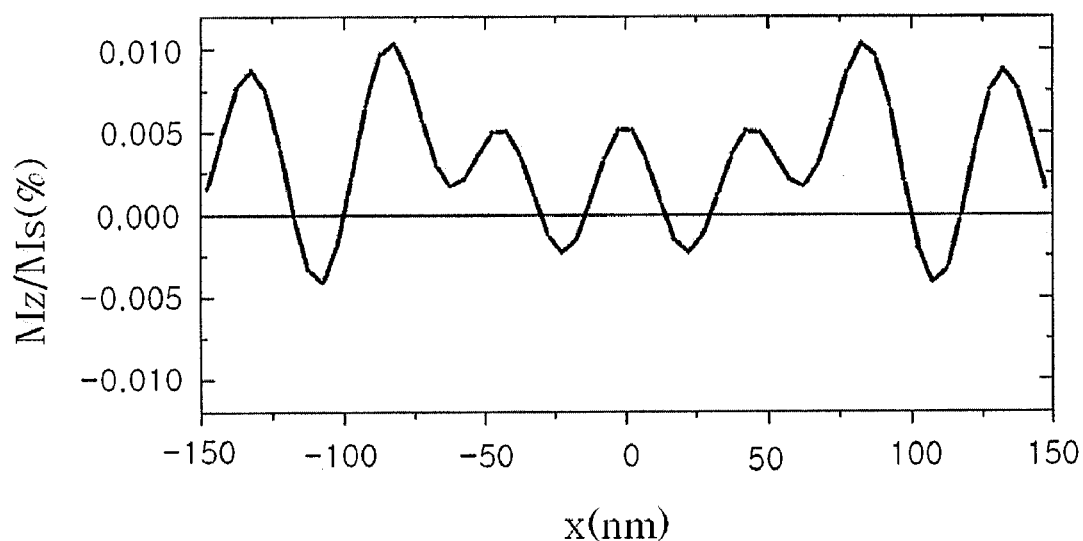
FIG. 13E illustrates an interference pattern of a spin wave on line Y-Y' of FIG. 13D.

FIGS. 13D and 13E illustrate the distribution of $M_z$ value of 37 GHz when time is 1 ns inside an area A indicated by a dotted line box. Interference patterns generated due to superposition of two radiated spin waves can be verified.

Next, a principle and a method of controlling wave factors of spin waves will be described in greater detail. As described previously, spin waves refer to wave movement in which precessional motions of respective spins are made by a magnetic interaction between the spins. This means that an effective magnetic field for deciding precessional motions of respective spins, magnetic intrinsic parameters and an interaction between spins are used to decide the wave factors of spin waves. Factors which affect an effective magnetic field and an interaction between respective spins include external factors such as an Oersted field, a stray field, elastic deformation, exchange coupling with other materials, a current, and a spin torque, and external characteristics such as exchange coupling, magnetic intrinsic parameters such as magnetic anisotropy constants, and a waveguide. The present invention provides a method of controlling wave factors, in particular, phase of spin waves, by controlling these factors.

FIGS. 14A through 14D illustrate magnetic intrinsic parameters and external characteristics of a waveguide and a change of dispersion relations change of spin waves due to an effective magnetic field. The dispersion relations of the spin waves represent the relations between wavelengths and frequencies of spin waves that travel toward a spin-wave waveguide. It can be noted that spin waves having given frequencies have which wavelengths with respect to given conditions (here, magnetic intrinsic parameters of a spin-wave waveguide and external factors).

Figure 14A:
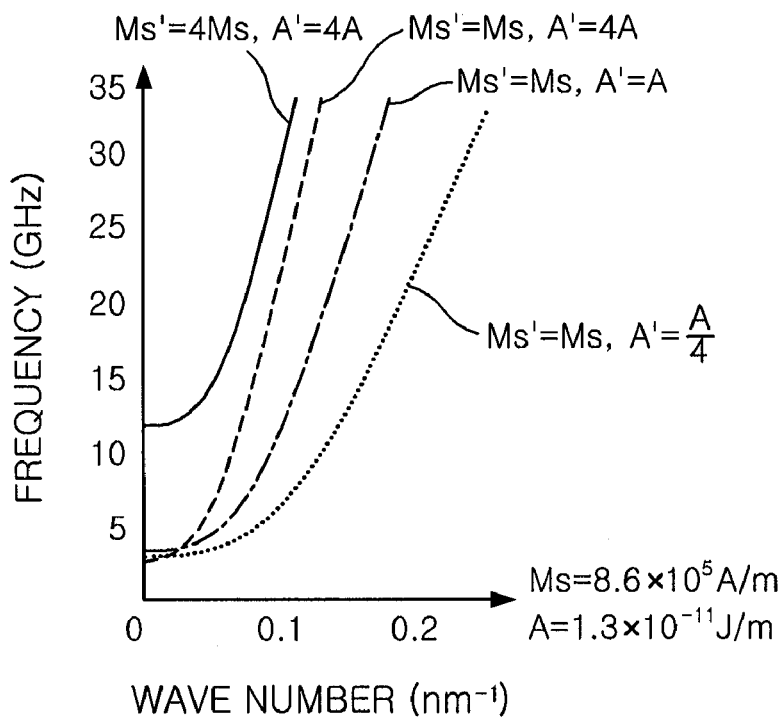
FIG. 14A illustrates the results of a change of dispersion relations according to magnetic intrinsic parameters of a spin-wave waveguide.

FIG. 14A illustrates the result of a change of dispersion relations according to magnetic intrinsic parameters of a spin-wave waveguide.

Referring to FIG. 14A, frequencies and wave numbers of spin waves are changed according to a saturation magnetization value Ms which is an magnetic intrinsic parameters, and according to an exchange coupling constant A. Since frequencies of spin waves are constant when the spin waves pass the spin-wave waveguide, wave numbers of the spin waves are changed in a portion in which magnetic intrinsic parameters are changed. That is, wavelengths (phases) are changed. Referring back to FIG. 14A, when Ms is the same and A decreases, wave numbers of the spin waves increase, and when Ms is the same and A increases, wave numbers of the spin waves decrease. Even when A is the same and Ms increases, wave numbers of the spin waves decrease.

Figure 14B:
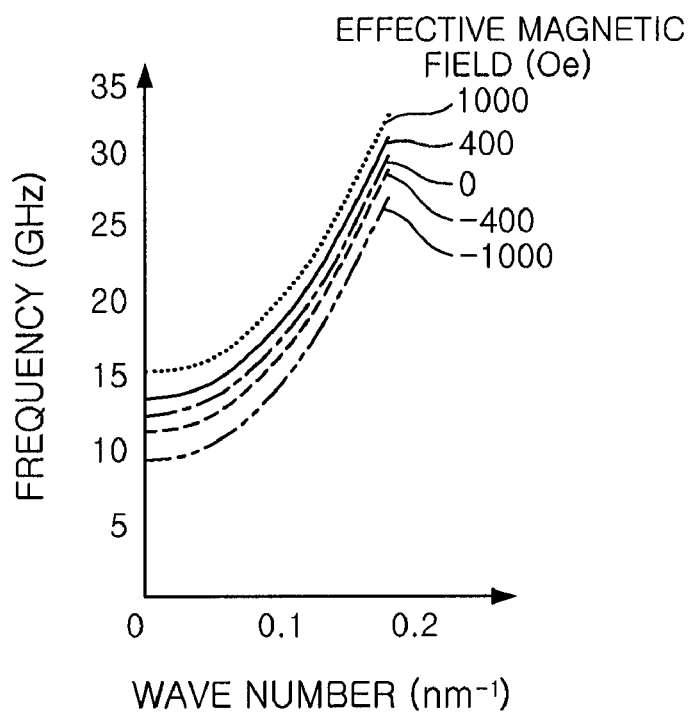
FIG. 14B illustrates the results of a change of dispersion relations according to size and direction of an effective magnetic field that affects a spin-wave waveguide.

FIG. 14B illustrates the result of a change of dispersion relations according to the size and direction of an effective magnetic field that affects a spin-wave waveguide.

Referring to FIG. 14B, frequencies and wave numbers of spin waves are changed according to effective magnetic fields. When effective magnetic fields of spin waves increase by positive quantity, wave numbers thereof decrease, and when effective magnetic fields of spin waves increase by negative quantity, wave numbers thereof increase. Accordingly, wavelengths (phases) of spin waves can be controlled according to effective magnetic fields.

Figure 14C:
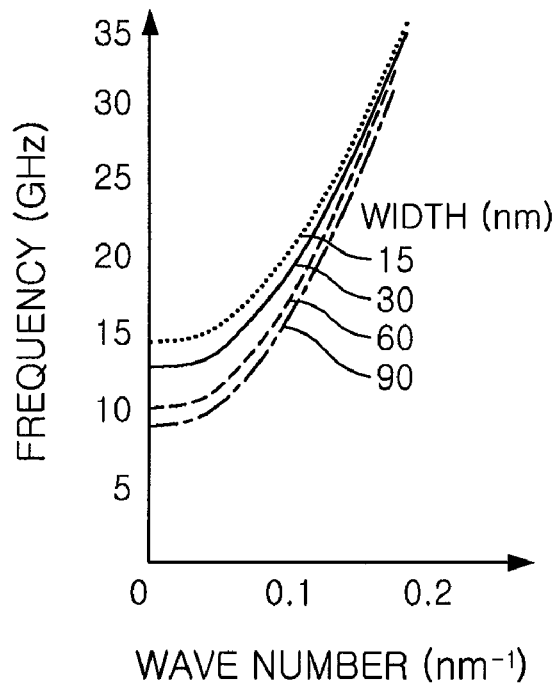
FIG. 14C illustrates the results of a change of dispersion relations according to the width of a spin-wave waveguide.
Figure 14D:
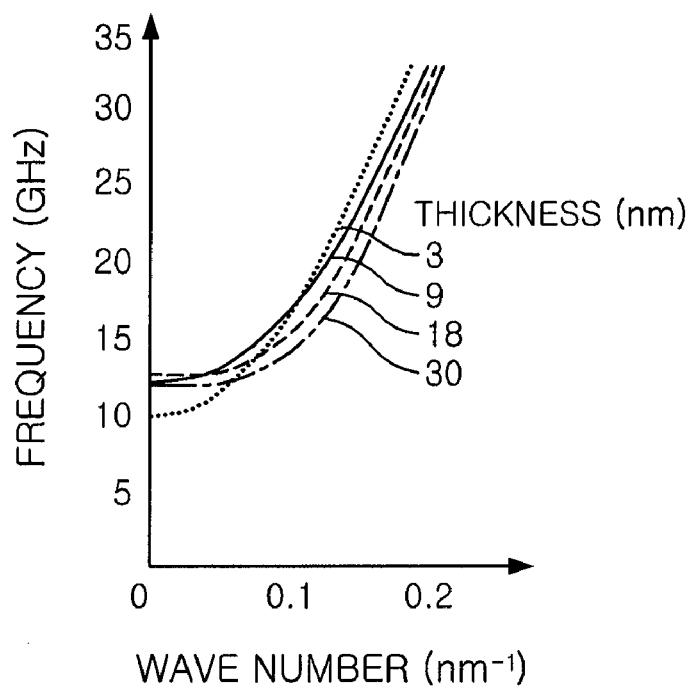
FIG. 14D illustrates the results of a change of dispersion relations according to the thickness of a spin-wave waveguide.

FIGS. 14C and 14D illustrate a change of dispersion relations according to the shapes of spin-wave waveguides. Referring to FIG. 14C, frequencies and wave numbers of spin waves are changed according to the widths of spin-wave waveguides, and in particular, wave numbers of the spin waves increase as the widths of the spin-wave waveguides increase. Referring to FIG. 14D, frequencies and wave numbers of the spin waves are changed according to the thicknesses of spin-wave waveguides, and in frequency ranges of 20 GHz and above, wave numbers of the spin waves increase as the thicknesses of the spin-wave waveguides increase.

It can be noted from FIGS. 14A through 14D that wavelengths, amplitudes and phases of spin waves, and a combination thereof can be changed and controlled by inserting a waveguide in a local area of traveling spin waves and by changing at least one of the shape and dimension of the waveguide and a magnetic material or by changing an effective magnetic field due to a change of external factors.

Figure 15A:
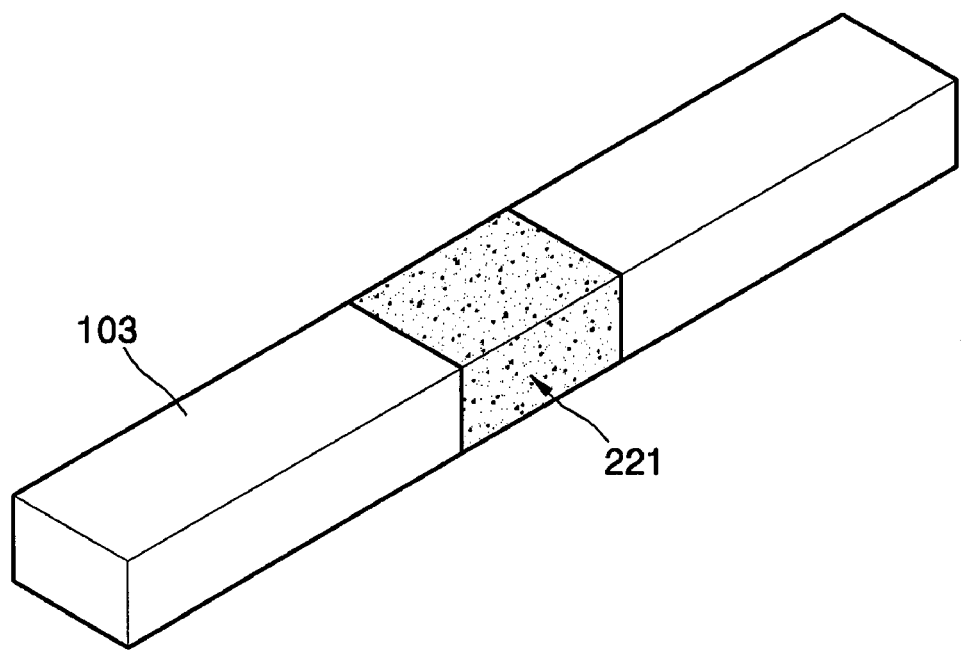
FIG. 15A illustrates the state where an effective magnetic field change occurs in a local area of a spin-wave waveguide according to an embodiment of the present invention.

FIG. 15A illustrates the state where a change of an effective magnetic field occurs in a local area of a spin-wave waveguide according to an embodiment of the present invention. Referring to FIG. 15A, the effective magnetic field is changed by inserting a waveguide having a different magnetic intrinsic parameters from that of the spin-wave waveguide 103 or a waveguide having a different shape from that of the spin-wave waveguide 103 in a local area 221 of the spin-wave waveguide 103 in which spin waves travel, or by using different methods.

An example in which the waveguide 105 formed of a different kind of magnetic material having a different magnetic intrinsic parameters from that of the spin-wave waveguide 103 is inserted in a local area of a spin-wave waveguide, has been already described with reference to FIGS. 12A through 12D. As described above, this different kind of waveguide 105 is inserted in the local area of the spin-wave waveguide and thus can be used as a spin wave filter, and the phases of spin waves can be controlled, as described here. The waveguide 105 is formed of a magnetic material and should have a different magnetic intrinsic parameters from that of the magnetic material of the spin-wave waveguide. As seen in the dispersion relations of FIG. 14A, the wavelengths of spin waves having given frequencies can be changed by saturation magnetization values and exchange coupling constants. In addition, it is obvious to one of ordinary skill in the art that magnetic anisotropy constants may also cause the same effect on the movement of spin waves. As other method than the insertion of the waveguide 105, the effective magnetic field can be changed by one of an Oersted field, a stray field, elastic deformation, exchange coupling with other magnetic material, a current, a spin torque, and the existence of a magnetic domain wall. Respective embodiments will be described later in detail.

Figure 15B:
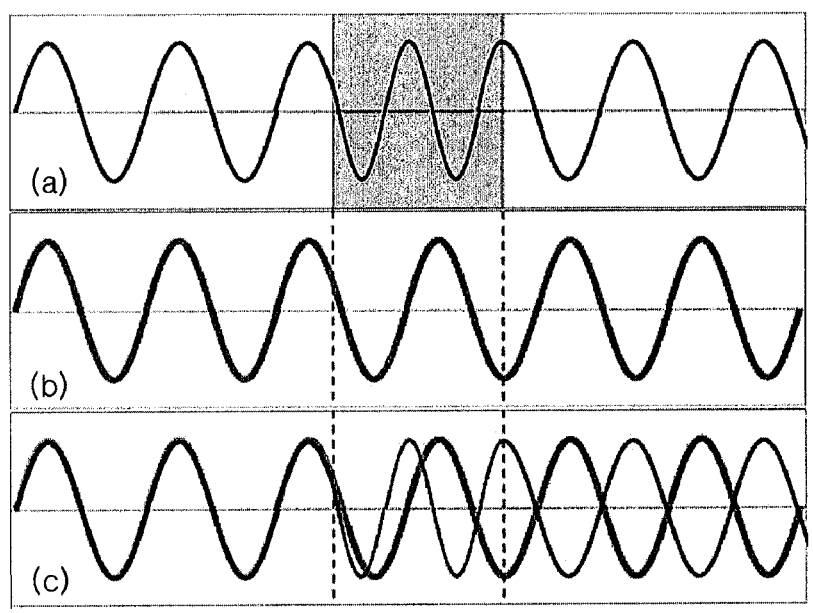
FIG. 15B illustrates embodiments for comparing propagation of spin waves that pass the waveguide of FIG. 15A, propagation of spin waves that do not pass the waveguide of FIG. 15A, and propagation of spin waves passing the waveguide of FIG. 15A.

FIG. 15B illustrates embodiments for comparing propagation of spin waves that passes the waveguide of FIG. 15A, propagation of spin waves that do not pass the waveguide of FIG. 15A, and propagation of spin waves passing the waveguide of FIG. 15A.

In FIG. 15B, (a) represents that the wavelengths of spin waves are changed when the spin waves traveling toward the spin-wave waveguide 103 pass the above-described local area 221. Traveling spin waves after passing the local area 221 are returned to their original wavelengths. However, in case of a spin-wave waveguide in which the local area 221 does not exist, the wavelengths of the spin waves are constant as illustrated in (b) so that a phase difference occurs between (a) and (b). Thus, as illustrated in (c), when a device for overlapping two spin waves is constructed so that the phase difference is 180 degrees, the two spin waves cause destructive interference by the principle of superposition among the above-described wave characteristics and annihilate. This is one embodiment in which the wavelengths, consequently, phases of the spin waves are controlled and signals are controlled using the superposition principle of the spin waves when amplitudes of the spin waves among the above-described spin factors are used as signals.

As other method than the insertion of the different kind of waveguide 105, specific embodiments of a method of changing the phases of spin waves through a change of the wavelengths of the spin waves in a local area by including a portion in which an effective magnetic field is changed, will now be described.

Figure 16:
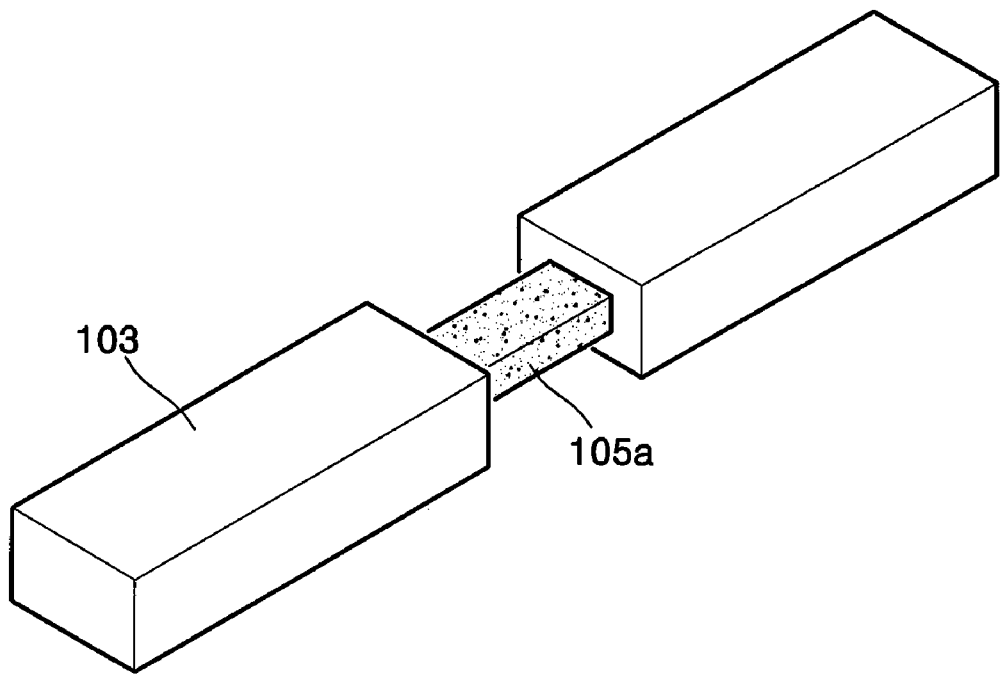
FIG. 16 illustrates core portions of a device for changing the phases of spin waves due to a change of the shape of a waveguide in a spin-wave waveguide according to an embodiment of the present invention.

FIG. 16 illustrates core portions of a device for changing the phases of spin waves by a change of shapes of waveguides in a spin-wave waveguide according to an embodiment of the present invention.

Referring to FIG. 16, by inserting a waveguide 105a having narrower width and thickness than those of a spin-wave waveguide 103, wave factors, in particular, the phases of spin waves are controlled using a change of shapes of spin-wave waveguides. Referring to the dispersion relations between FIGS. 14C and 14D, wavelengths of spin waves having predetermined frequencies are changed according to thickness and width of a waveguide. Referring to FIG. 16, by changing either thickness or width or both thickness and width of the waveguide 105a unlike the spin-wave waveguide 103, the phases of the spin waves passing the spin-wave waveguide 103 are controlled. That is, the wavelengths, amplitudes, phases of spin waves or a combination thereof can be changed by changing the shape or dimension of the inserted waveguide 105a. The waveguide 105a may also be formed of the same kind of magnetic material as a material used in forming the spin-wave waveguide 103.

Figure 17:
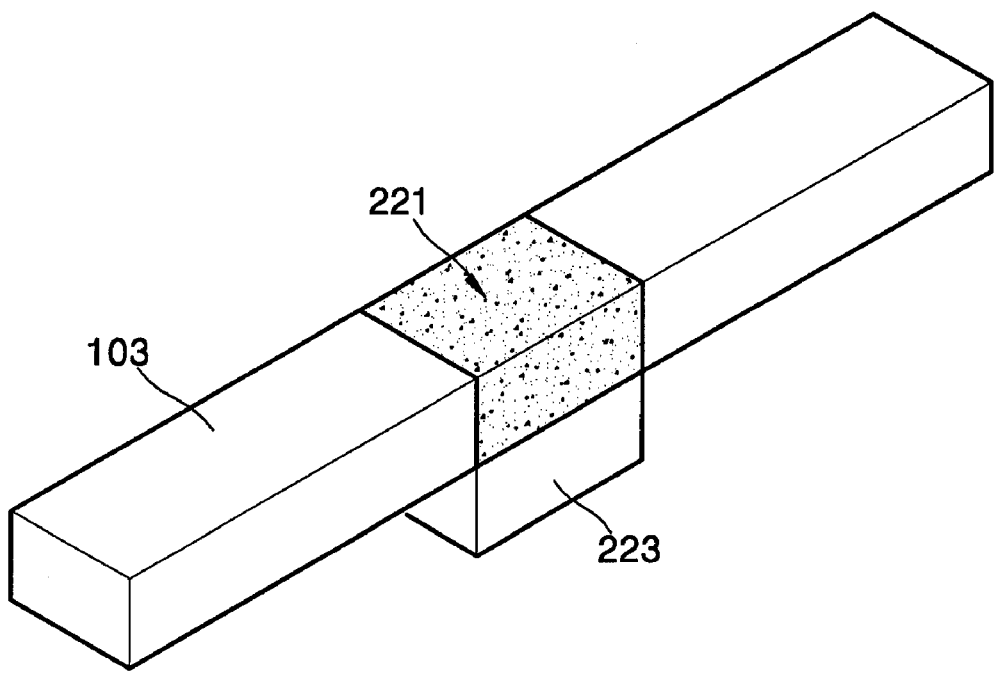
FIG. 17 illustrates core portions of a device for changing the phases of spin waves due to an exchange coupling with an interface between the spin-wave waveguide and other magnetic material by joining other magnetic material to the spin-wave waveguide according to an embodiment of the present invention.

FIG. 17 illustrates core portions of a device for changing the phases of spin waves by an exchange coupling with an interface between a spin-wave waveguide and a magnetic material by joining a different kind of magnetic material to the spin-wave waveguide according to an embodiment of the present invention.

Referring to FIG. 17, the wavelengths of spin waves are changed by an exchange coupling with an interface between the magnetic layer 223 joined to the local area 221 of the spin waveguide 103 and the spin-wave waveguide 103. The exchange coupling causes a change of an effective magnetic field of the local area 221 and this changes the phases of traveling spin waves, as described above. The magnetic layer 223 may be one material selected from the group consisting of ferromagnetic materials, antiferromagnetic materials, ferrimagnetic materials, alloy-based magnetic materials, oxide-based magnetic materials, colossal magneto resistance (CMR)-based magnetic materials, Heusler alloy-based magnetic materials, a magnetic semiconductor, and a combination thereof.

The above-described method of controlling the phases of spin waves uses inherent characteristics or shape of a waveguide and can be used as a static phase modulation apparatus of phase modulation apparatuses that will be described later. A method of controlling a phase change of spin waves according to input signals unlike the above-described method will now be described.

Figure 18A:
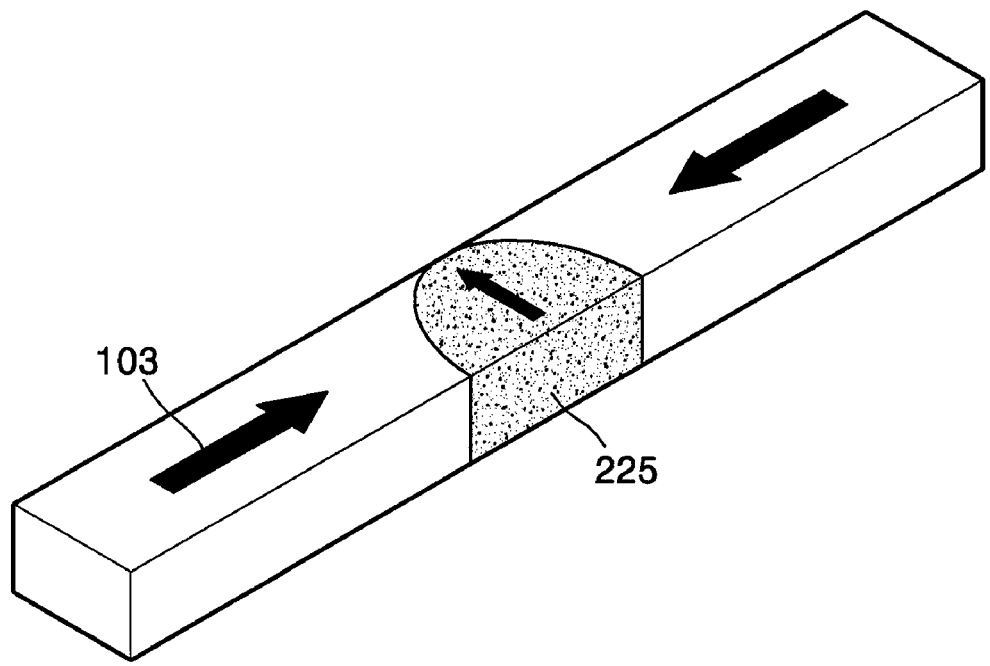
FIG. 18A illustrates core portions of a device for changing the phases of spin waves by using a magnetic domain wall formed in a spin-wave waveguide.

FIG. 18A illustrates core portions of a device for changing the phases of spin waves using a magnetic domain wall formed in a spin-wave waveguide.

Referring to FIG. 18A, a magnetic domain wall 225 exists in the spin-wave waveguide 103. The magnetic domain wall 225 may be one selected from the group consisting of a 90-degree magnetic domain wall, a 180-degree magnetic domain wall, a 360-degree magnetic domain wall, a Bloch-type magnetic domain wall, a Neel-type magnetic domain wall, and a combination thereof. The wavelengths of the spin waves passing the magnetic domain wall 225 are changed by an effective magnetic field formed on the magnetic domain wall 225. The present invention is not limited to the simple use of the magnetic domain wall 225 and also provides a method of changing an effective magnetic field by inserting the magnetic domain wall 225 in the spin-wave waveguide 103 or by removing the magnetic domain wall 225 from the spin-wave waveguide 103.

Figure 18B:
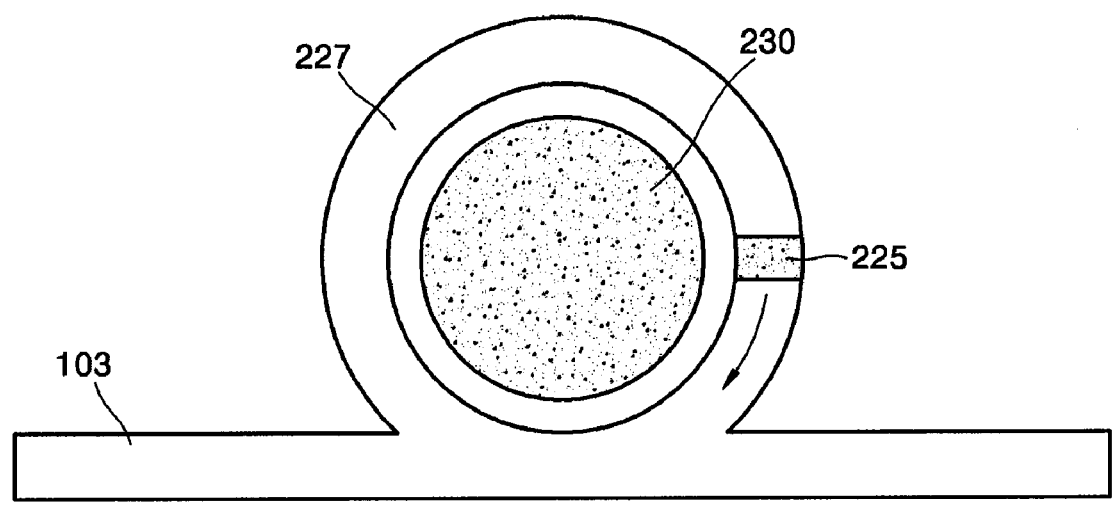
FIG. 18B illustrates core portions of a device for changing the phase of spin waves by inserting a magnetic domain wall in a spin-wave waveguide or by removing the magnetic domain wall from the spin-wave waveguide using an Oersted field generated due to a current flowing through a conducting wire according to an embodiment of the present invention.
Figure 18C:
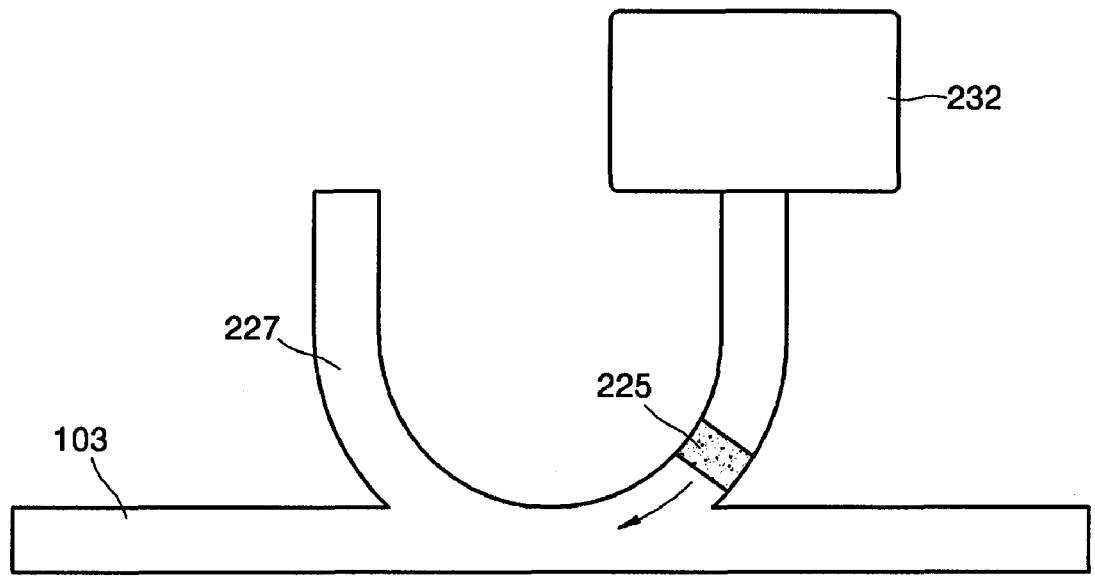
FIG. 18C illustrates core portions of a device for changing the phases of spin waves by inserting a magnetic domain wall in a spin-wave waveguide or by removing the magnetic domain wall from the spin-wave waveguide by a current flowing through a magnetic domain wall waveguide according to an embodiment of the present invention.
Figure 18D:
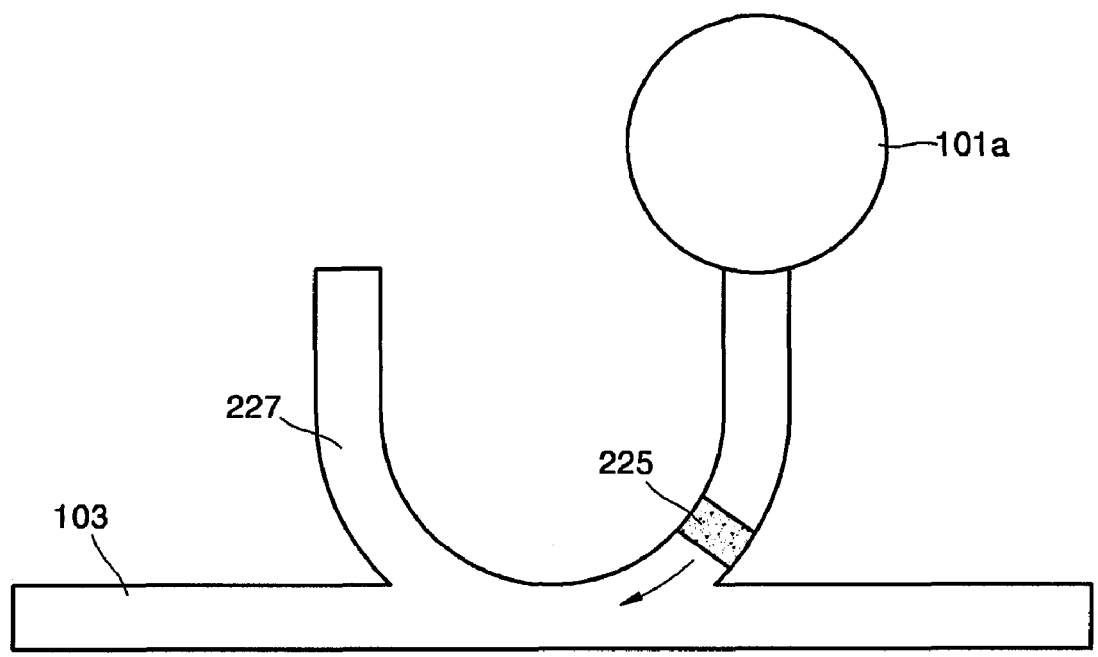
FIG. 18D illustrates core portions of a device for changing the phase of spin waves by inserting a magnetic domain wall in a spin-wave waveguide or by removing the magnetic domain wall from the spin-wave waveguide by making a strong spin wave incident on the magnetic domain wall according to an embodiment of the present invention.

FIG. 18B illustrates core portions of a device for changing the phases of spin waves by inserting a magnetic domain wall in a spin-wave waveguide or by removing the magnetic domain wall from the spin-wave waveguide using an Oersted field generated due to a current flowing through a conducting wire according to an embodiment of the present invention, FIG. 18C illustrates core portions of a device for changing the phases of spin waves by inserting a magnetic domain wall in a spin-wave waveguide or by removing the magnetic domain wall from the spin-wave waveguide by a current flowing through a magnetic domain wall waveguide according to an embodiment of the present invention, and FIG. 18D illustrates core portions of a device for changing the phases of spin waves by inserting a magnetic domain wall in a spin-wave waveguide or by removing the magnetic domain wall from the spin-wave waveguide by making strong spin waves injected into the magnetic domain wall according to an embodiment of the present invention.

Referring to FIG. 18B, both ends of the magnetic domain wall waveguide 227 in which the magnetic domain wall 225 can move, are connected to the spin-wave waveguide 103 so that the magnetic domain wall 225 can be inserted in or removed from the spin-wave waveguide 103 and the device can be used as a dynamic phase shifting apparatus that will be described later. In order to move the magnetic domain wall 225, a magnetic field-applying conducting wire 230 which extends vertically to the spin-wave waveguide 103 and through which a current flows, is further included, and both ends of the magnetic domain wall waveguide 227 are connected to the spin-wave waveguide 103 so that the magnetic domain wall waveguide 227 can surround the magnetic field-applying conducting wire 230. The magnetic domain wall 225 is moved by forming an Oersted field around the magnetic field-applying conducting wire 230 by flowing a current through the magnetic field-applying conducting wire 230.

Alternatively, the magnetic domain wall 225 moves as illustrated in FIG. 18C, and the magnetic domain wall waveguide 227 whose middle portion excluding both ends is connected to the spin-wave waveguide 103, is disposed, and a power unit 232 is connected to one end of both ends of the magnetic domain wall waveguide 227, and the magnetic domain wall 225 is moved by flowing a current through the magnetic domain wall waveguide 227.

In addition, the magnetic domain wall 225 can move as illustrated in FIG. 18D, and the magnetic domain wall waveguide 227 whose middle portion excluding both ends is connected to the spin-wave waveguide 103, is disposed, and an additional spin wave-generating unit 101a is connected to one or both ends of the magnetic domain wall waveguide 227, and strong spin waves generated in the additional spin wave-generating unit 101a are propagated through the magnetic domain wall waveguide 227 so that the magnetic domain wall 225 can be moved.

As illustrated in FIGS. 18B through 18D, the phases of traveling spin waves may be changed by inserting the magnetic domain wall 225 in the spin-wave waveguide 103 or the phases of the spin waves may not be changed by removing the magnetic domain wall 225 from the spin-wave waveguide 103. In this way, since whether the phases of the spin waves that travel toward the spin-wave waveguide 103 will be changed or not can be controlled by using a current of the power unit 232 or the magnetic field-applying conducting wire 230 and a spin wave-generating unit 101a as an input signal, the device can be used as a dynamic phase shifting apparatus.

Figure 19:
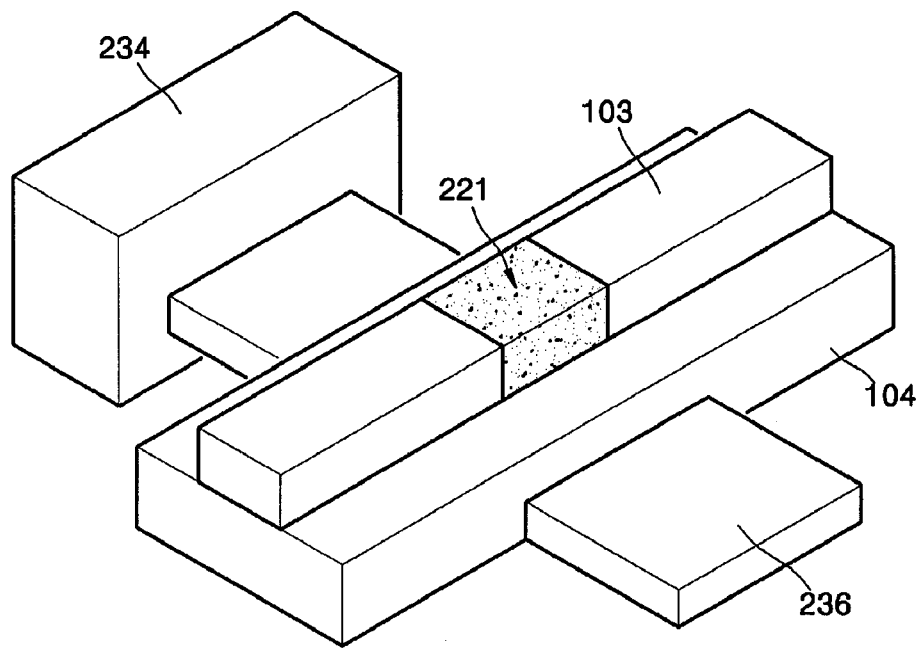
FIG. 19 illustrates core portions of a device for changing the phases of spin waves by applying an Oersted field to a local area of a spin-wave waveguide.

FIG. 19 illustrates core portions of a device for changing phases of spin waves by applying an Oestered field to a spin-wave waveguide in a local area according to an embodiment of the present invention.

Referring to FIG. 19, the Oestered field is applied to the local area 221 of the spin-wave waveguide 103 to cause a change of an effective magnetic field so that the phases of spin waves are controlled. Specifically, when a current flows through the magnetic field-applying conducting wire 236 going across the spin-wave waveguide 103 using the power unit 234, the Oestered field is strongly applied to the local area 221 of the spin-wave waveguide 103 and an effective magnetic field is changed. Then, as seen from a change of dispersion relations of FIG. 14B, the wavelengths of the spin waves having predetermined frequencies are changed according to intensity and direction of the effective magnetic field. As such, the intensity and direction of a current are adjusted so that the phases of the spin waves can be controlled, as described above. In addition, the device can be used as a dynamic phase shifting apparatus in which the power unit 234 is used as an input signal.

Figure 20:
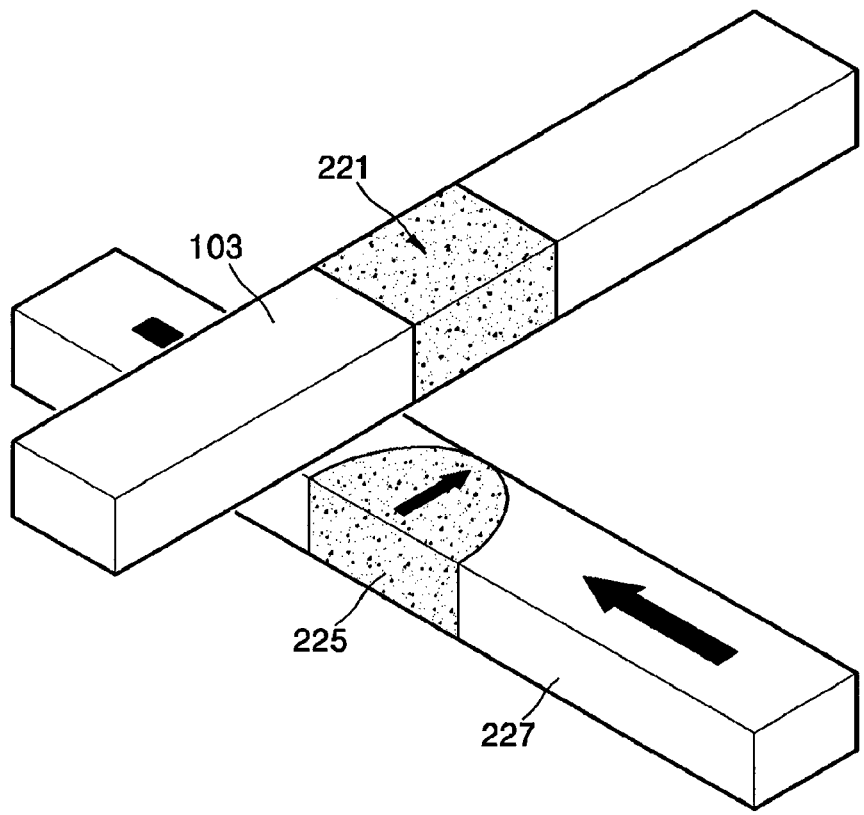
FIG. 20 illustrates core portions of a device for changing the phases of spin waves by applying a stray field due to a magnetic domain wall to a local area of a spin-wave waveguide according to an embodiment of the present invention.

FIG. 20 illustrates core portions of a device for changing the phases of spin waves by employing a stray field generated due to a magnetic domain wall to a spin-wave waveguide in a local area according to an embodiment of the present invention.

Referring to FIG. 20, the phases of the spin waves are controlled by a change of an effective magnetic field due to the stray field formed around the magnetic domain wall 225. Specifically, a very strong stray field is locally formed in the vicinity of the magnetic domain wall 225 unlike around the magnetic domain wall 225. In the present invention, the phases of the spin waves are controlled by changing an effective magnetic field by applying the stray field to the local area 221 of the spin-wave waveguide 103. Here, the magnetic domain wall 225 moves along the magnetic domain wall waveguide 227 that extends horizontally while forming a predetermined angle with the spin-wave waveguide 103 under the spin-wave waveguide 103. The magnetic domain wall 225 is moved by applying an external magnetic field, by flowing a current or by generating strong spin waves, like the method described in FIGS. 18B, 18C, and 18D. That is, since the stray field due to the magnetic domain wall 225 is formed only in the local area 221, whether the phases of spin waves traveling toward the spin-wave waveguide 103 will be changed or not can be controlled depending on whether the magnetic domain wall 225 is located or not in the vicinity of the spin-wave waveguide 103. Thus, the device can be used as a dynamic phase shifting apparatus.

Figure 21:
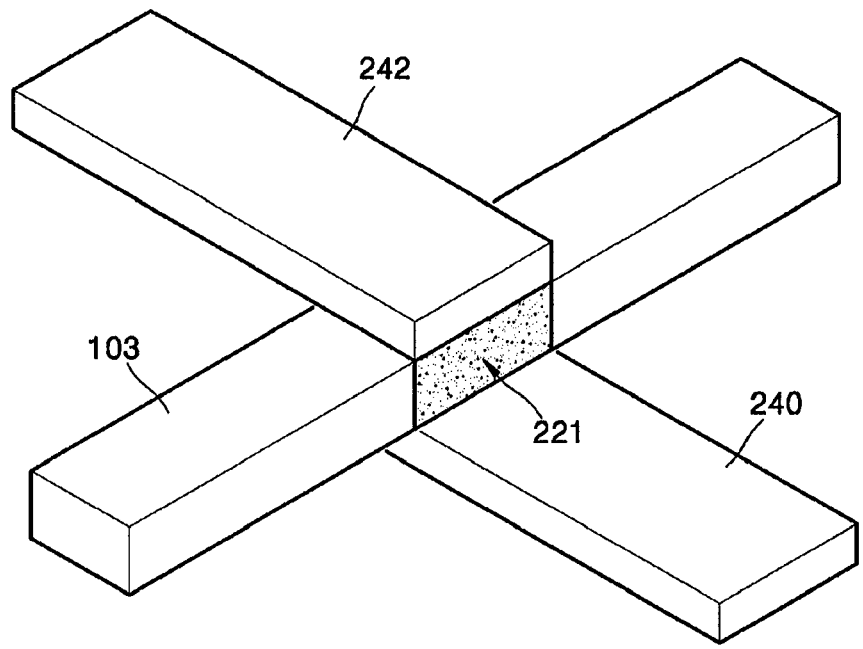
FIG. 21 illustrates core portions of a device for changing the phases of spin waves using a spin torque according to an embodiment of the present invention.

FIG. 21 illustrates core portions of a device for changing the phases of spin waves using a spin torque according to an embodiment of the present invention.

Referring to FIG. 21, currents flow through a first conducting wire 240 that extends horizontally from a lower portion of the spin-wave waveguide 103 and a second conducting wire 242 that extends horizontally from an upper portion of the spin-wave waveguide 103. Then, the phases of the spin waves are changed by a change of an effective magnetic field or a torque action due to a spin torque of electrons that are spin-polarized in the local area 221 of the spin-wave waveguide 103. Here, degree and possibility of a change of the phases of the spin waves can be controlled from the amount and direction of the currents flowing through the first and second conducting wires 240 and 242. Thus, the device can be used as a dynamic phase shifting apparatus.

Figure 22:
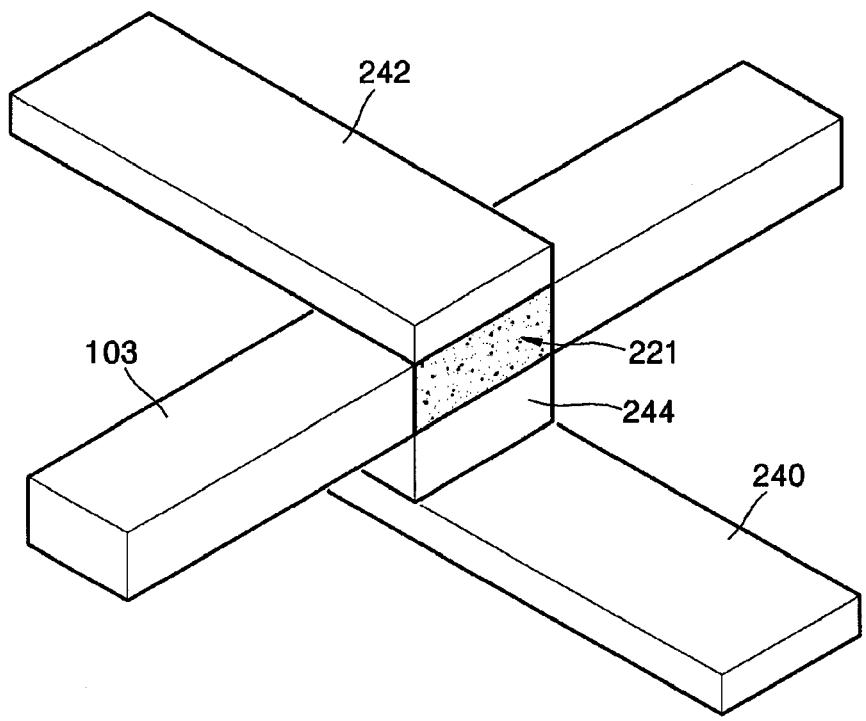
FIG. 22 illustrates core portions of a device for changing the phases of spin waves using elastic deformation according to an embodiment of the present invention.

FIG. 22 illustrates core portions of a device for changing the phases of spin waves using elastic deformation according to an embodiment of the present invention.

As illustrated in FIG. 22, a piezoelectric body 244 is further included to the structure of FIG. 21. The piezoelectric body 244 may be included between a spin-wave waveguide 103 and a first conducting wire 240 or between the spin-wave waveguide 103 and a second conducting wire 242. That is, the piezoelectric body 244 is inserted in the local area 221 of the spin-wave waveguide 103 and voltages are applied to the first and second conducting wires 240 and 242 to cause elastic deformation of the piezoelectric body 244, and when elastic deformation of the local area 221 is caused from the deformation, a magnetic anisotropy characteristic and magnetization direction of the local area 221 are changed by inverse magnetostriction. And, this causes a local effective magnetic field change in the same principle as a change of magnetic intrinsic parameters so that a change of the phases of the spin waves is generated. Voltages applied to the first and second conducting wires 240 and 242 are adjusted so that elastic deformation of the piezoelectric body 244 can be controlled. Thus, the device can be used as a dynamic phase shifting apparatus for controlling a change of the phases of the spin waves using the applied voltages as input signals.

Basically, the state where spin waves generated in the present invention is referred to as "1" and the state where spin waves do not exist is referred to as "0" so that "0" and "1" can be discriminated from each other. The state where the spin waves do not exist can be made by not generating spin waves or by controlling wave factors of the spin waves using the above-described method and by overlapping destructively two spin waves having a phase difference of 180 degrees, as illustrated in FIGS. 13A through 13E.

Hereinafter, examples for constructing logic operation means, such as an OR gate, an XOR gate, a NOR gate, an AND gate, a NAND gate, and an inverter, by employing the spin wave device of the present invention will be described. By properly combining these logic operation means, any kind of logic operations can be performed.

Figure 23A:
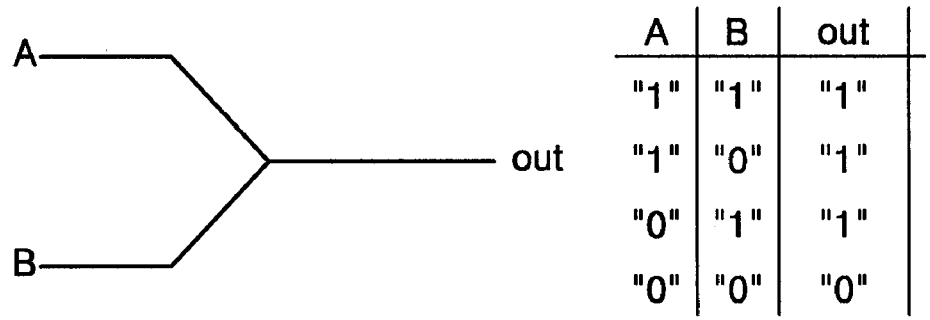
FIG. 23A is a conceptual view of an OR gate using spin waves.
Figure 23B:
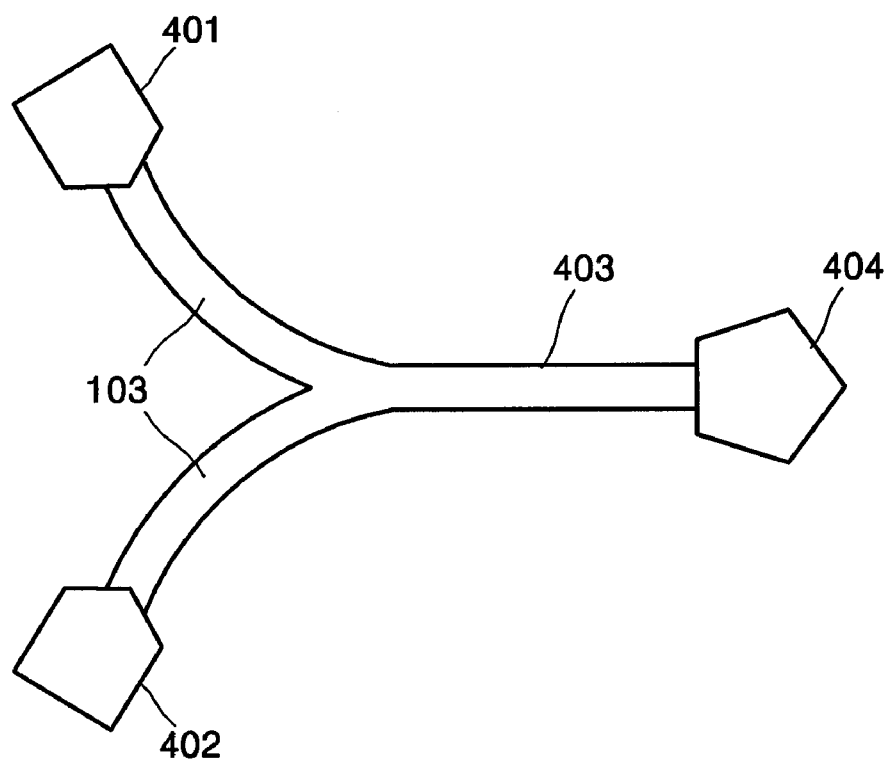
FIG. 23B illustrates a spin wave device for implementing the OR gate according to an embodiment of the present invention.

FIG. 23A is a conceptual view of an OR gate in which A and B are set to input and out is set to output, and FIG. 23B illustrates a spin wave device for implementing the OR gate according to an embodiment of the present invention.

Referring to FIG. 23A, in the OR gate, as well-known, when pairs of A and B are "1", "1", "1", "0", and "0", "1", respectively, out becomes "1", and when a pair of A and B is "0", "0", out becomes "0".

Referring to FIG. 23B, a first unit 401 and a second unit 402 each including a spin wave-generating unit and an energy-supplying unit (for example, a magnetic field-applying conducting wire and a power unit, as described in FIG. 10A) are connected by two curve-shaped spin-wave waveguides 103 and a coupling spin-wave waveguide 403 in which the two spin-wave waveguides 103 are coupled with each other. The two spin-wave waveguides 103 have the same length. The first and second units 401 and 402 are spin wave signal-inputting units, and a spin wave signal-outputting unit 404 is disposed on the end of the spin-wave waveguide 403.

When spin waves are generated in the first unit 401 and the second unit 402 by the supply of an energy, the spin waves travel toward the spin-wave waveguide 103, and logic operations are performed by the principle of superposition which is one of wave characteristics in the spin-wave waveguide 403. As described above, output signals "0" and "1" represent the existence of spin waves in the spin wave signal-outputting unit 404. When signal "1" by the supply of the energy is simultaneously inputted to the first unit 401 and the second unit 402 in the device illustrated in FIG. 23B, spin waves are generated in each of the first unit 401 and the second unit 402 and travel toward the coupling spin-wave waveguide 403 via the spin-wave waveguide 103. In this case, since the lengths of the two spin-wave waveguides 103 are the same, the two spin waves traveling through each spin-wave waveguide 103 are overlapped with the same phase in the coupling spin-wave waveguide 403. Thus, spin waves exist in the coupling spin-wave waveguide 403 and signal of "1" is outputted to the spin wave signal-outputting unit 404.

When only one-side input signal is "1", that is, when spin waves are generated in any one of the first unit 401 and the second unit 402, spin waves exist in the coupling spin wave guide 403 without superposition. Thus, signal of "1" is also outputted to the spin wave signal-outputting unit 404. In case of "0" in which there is no input signal, since spin waves are not generated in any one of the first unit 401 and the second unit 402, "0" is outputted to the spin wave signal-outputting unit 404. As such, the present device becomes OR gate.

Figure 24:
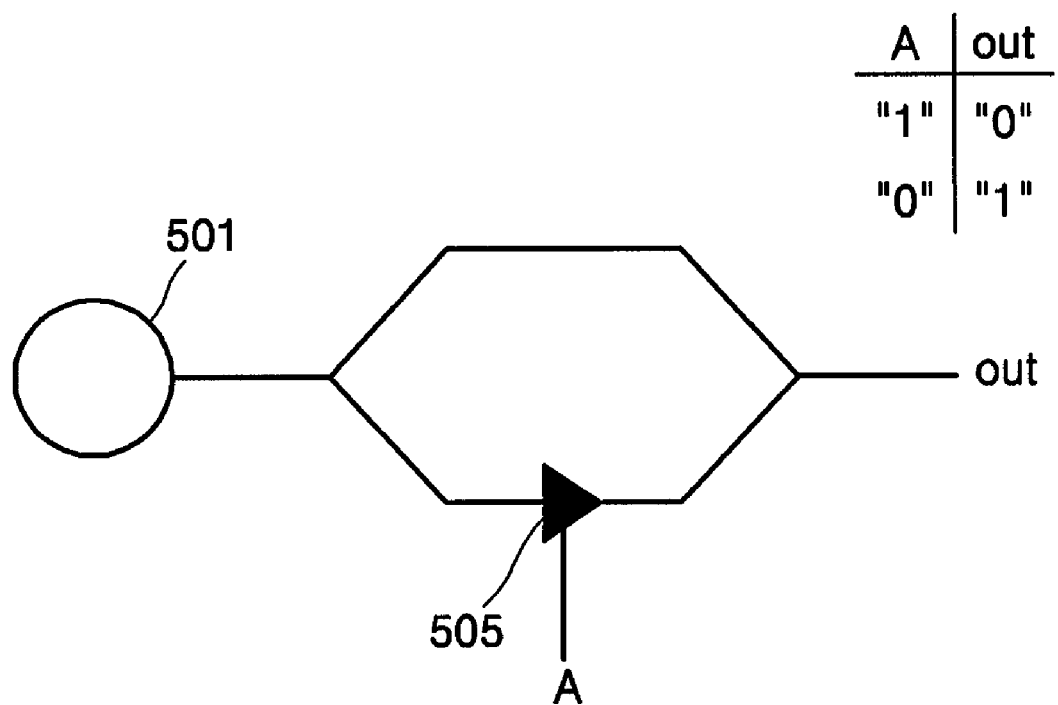
FIG. 24 is a conceptual view of an inverter using spin waves.

FIG. 24 is a conceptual view of an inverter (that is, an NOT gate). A device 501 for continuously generating spin waves is indicated by circle, and a dynamic phase shifting apparatus 505 is indicated by full triangle. In the dynamic phase shifting apparatus 505, the phases of spin waves are shifted by 180 degrees only by injecting spin waves from two directions. That is, a stimulating signal should be applied to the dynamic phase shifting apparatus 505 so that the phases of the spin waves passing the dynamic phase shifting apparatus 505 are shifted by 180 degrees. It is obvious to one of ordinary skill in the art to construct the dynamic phase shifting apparatus 505 by using spin wave phase shifting methods described above in detail.

In FIG. 24, the spin waves generated in the device 501 for continuously generating spin waves are divided into two waves, and one of the two spin waves passes the dynamic phase shifting apparatus 505. In this case, when signal of "1" is given to input A (preferably, spin waves generated by using a unit including a spin wave-generating unit and an energy-supplying unit, like in the present invention are used as input signals.), the phases of the spin waves passing the dynamic phase shifting apparatus 505 are shifted by 180 degrees. Thus, state of "0" is made when the two spin waves are overlapped with each other and are outputted. Meanwhile, when input A is "0", the phases of the spin waves passing the dynamic phase shifting apparatus 505 are not shifted. Thus, state of "1" is made when the two spin waves are superposed with each other and are outputted. It is obvious to one of ordinary skill in the art to implement such an inverter by employing the spin wave device according to the present invention by connecting a plurality of units to a spin-wave waveguide. In FIG. 24, the device 501 for continuously generating spin waves corresponds to a first unit including a spin wave-generating unit and an energy-supplying unit (for example, a magnetic field-applying conducting wire and a power unit, as described in FIG. 1A), a solid line corresponds to a spin-wave waveguide, and input A corresponds to a second unit.

Figure 25A:
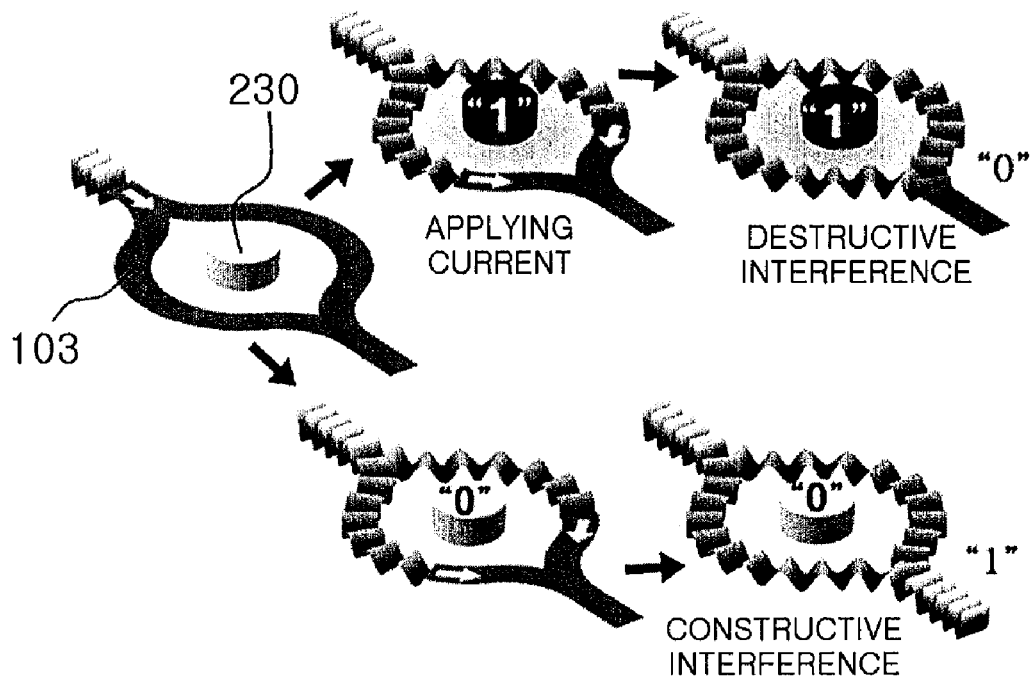
FIG. 25A illustrates an inverter gate using a change of the phases of spin waves due to an Oestered field according to an embodiment of the present invention.

FIG. 25A illustrates an inverter gate using a change of the phases of spin waves due to an Oestered field according to an embodiment of the present invention, and micromagnetic simulation results are shown in FIGS. 25B through 25E.

Referring to FIG. 25A, continuously-generated spin waves pass the spin-wave waveguide 103 that is divided into two horizontal paths. A magnetic field-applying conducting wire 230 through which a current flows perpendicularly to the spin-wave waveguide 103, is disposed between the two-path spin-wave waveguide 103 so that a circular Oestered field is formed around the magnetic field-applying conducting wire 230 when a current flows through the magnetic field-applying conducting wire 230 (this case is the same as the case where a signal is inputted to input A in FIG. 24). The Oestered field allows an external magnetic field in other direction to be applied to the two-path spin-wave waveguide 103 and to effectively cause a phase difference of the spin waves traveling the two-path spin-wave waveguide 103. Thus, the phase difference of the two-path spin-wave waveguide 103 may be 180 degrees through a proper current intensity, and the superposed spin waves annihilate by destructive interference and state of "0" is made. On the other hands, when a current does not flow through the magnetic field-applying conducting wire 230 disposed in the middle of the two-path spin-wave waveguide 103, the phases of the spin waves are not shifted even when the continuously-generated spin waves pass the two-path spin-wave waveguide 103. Thus, when the two spin waves are superposed with each other and are outputted, state of "1" is made by constructive interference.

Figure 25B:
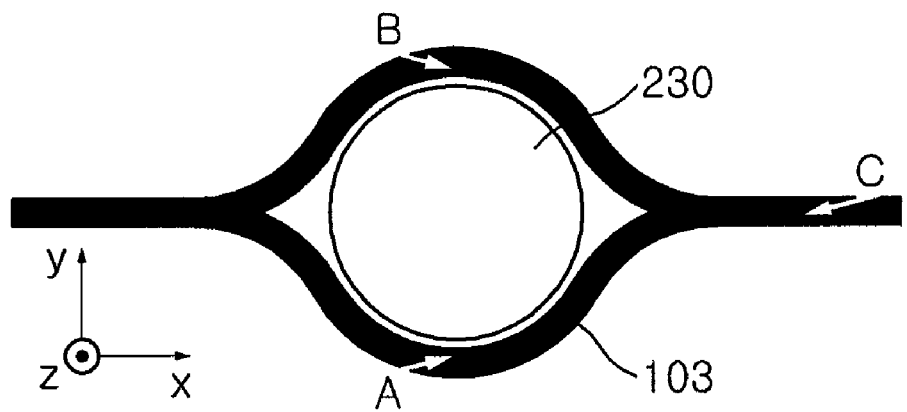
FIG. 25B illustrates a model structure for simulating operating of a spin wave inverter gate using an Oestered field.

FIG. 25B illustrates a model structure for simulating driving of a spin wave inverter gate using an Oestered field, and in actuality, simulation is performed using the model.

Figure 25C:
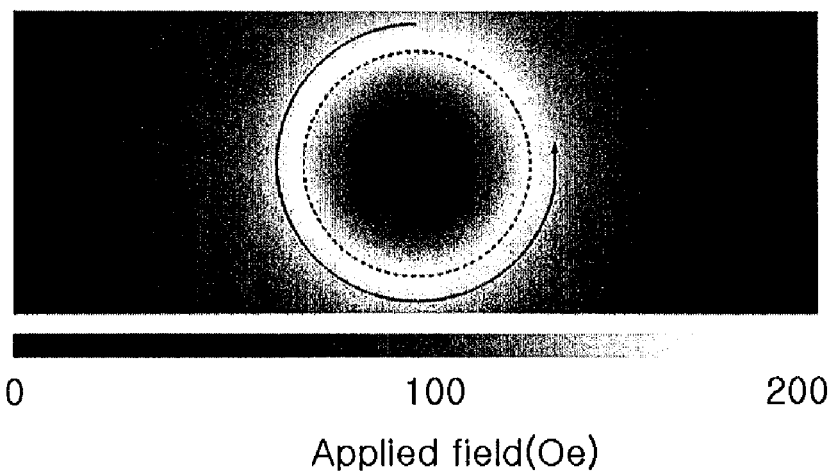
FIG. 25C illustrates the result of size distribution and direction of an Oestered field according to an embodiment of the present invention.

FIG. 25C illustrates the result of size distribution and direction of an Oestered field according to an embodiment of the present invention. The intensity and direction distribution of the Oestered field formed when a current flows through the magnetic field-applying conducting wire 230 are shown in FIG. 25C.

Figure 25D:
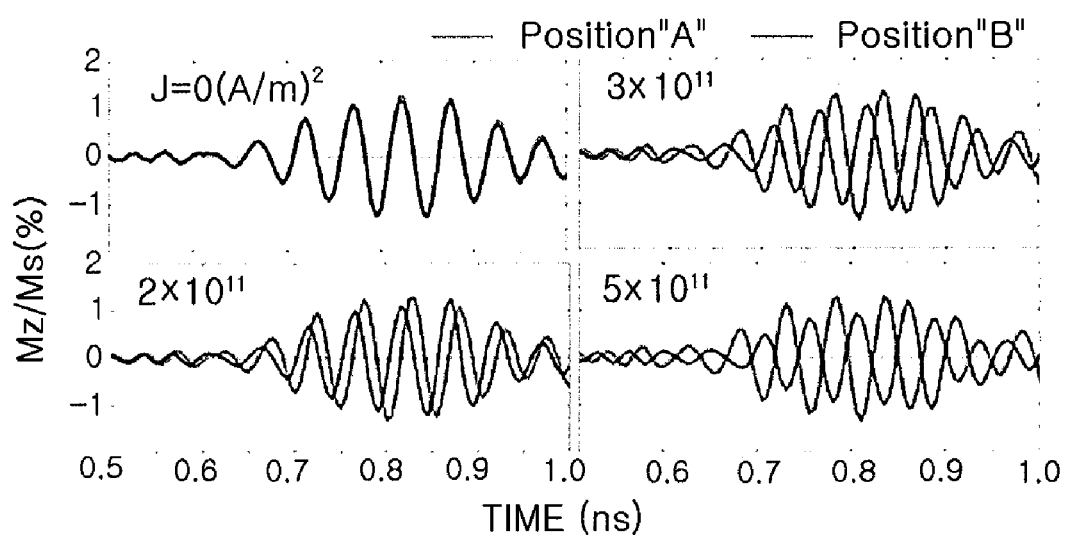
FIG. 25D illustrates a change of the phases of spin waves according to the size of current applied to a conducting wire according to an embodiment of the present invention.

FIG. 25D illustrates a change of the phases of spin waves according to the size of current applied to a conducting wire according to an embodiment of the present invention.

A change of amplitudes of spin waves according to time in positions "A" and "B" respectively disposed in the middle of the two-path spin-wave waveguide 103 in FIG. 25B is shown in FIG. 25D. It can be seen from FIG. 25D that the spin waves traveling toward the two-path spin-wave waveguide 103 show a phase difference according to the intensity of current.

Figure 25E:
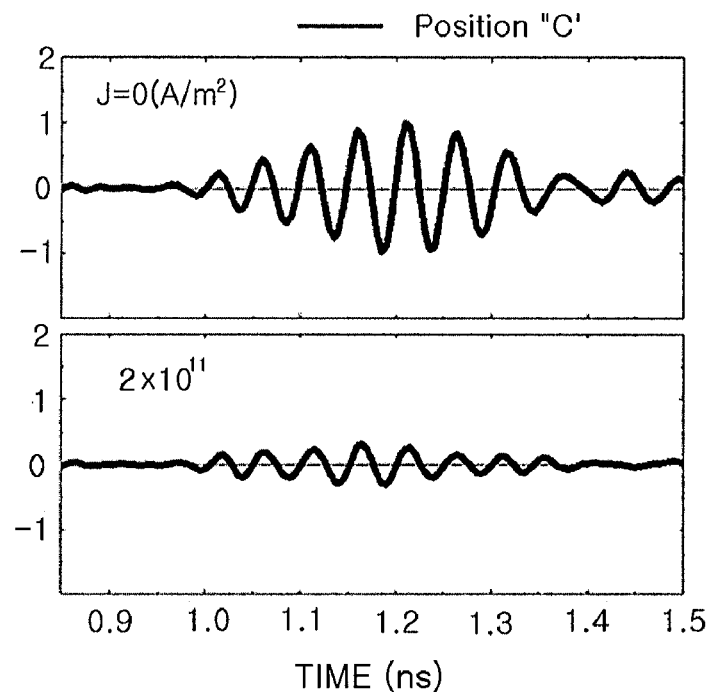
FIG. 25E illustrates the case where an output signal of a spin wave inverter gate performs an inverter gate operation by adjusting interference of spin waves according to a current input signal according to an embodiment of the present invention.

FIG. 25E illustrates the case where an output signal of a spin wave inverter gate performs an inverter gate operation by adjusting interference of spin waves according to a current input signal according to an embodiment of the present invention.

FIG. 25E is a graph showing a change of amplitudes of spin waves according to time in a position "C" in which respective spin waves traveling along the two-path spin-wave waveguide 103 are superposed with each other and travel. When a current flows through the magnetic field-applying conducting wire 230, destructive interference occurs, and constructive interference occurs when a current of spin waves does not flow through magnetic field-applying conducting wire 230.

Figure 25F:
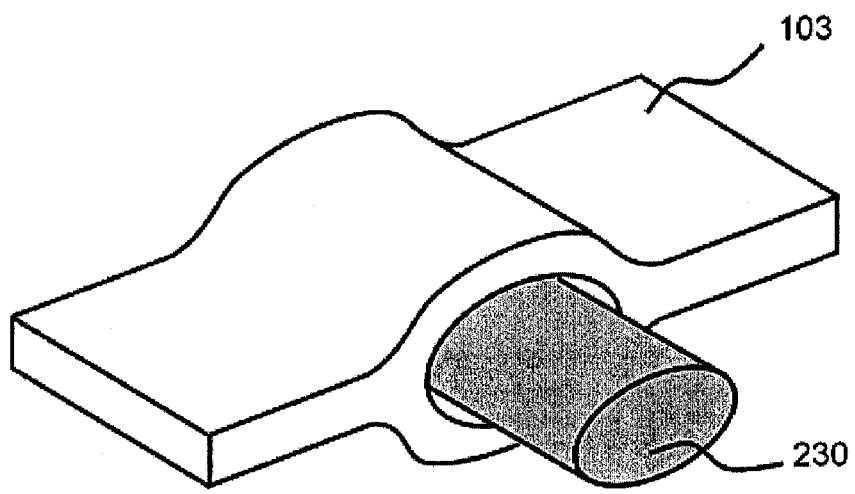
FIG. 25F illustrates an inverter gate using a change of the phases of spin waves due to an Oestered field according to an embodiment for illustrating other structure of an inverter gate.

FIG. 25F illustrates an embodiment for illustrating other structure of an inverter gate. Referring to FIG. 25F, a spin-wave waveguide 103 that is divided into upper and lower paths is disposed, and a magnetic field-applying conducting wire 230 that extends horizontally while forming a predetermined angle with the spin-wave waveguide 103 is disposed between the two-path spin-wave waveguide 103 so that, when a current flows through the magnetic field-applying conducting wire 230, a circular Oestered field can be formed around the magnetic field-applying conducting wire 230. The Oestered field allows an external magnetic field in other direction to be applied to the two-path spin-wave waveguide 103 and to effectively cause a phase difference of the spin waves traveling toward the two-path spin-wave waveguide 103. When manufacturing a device, the structure is easier constituted than the structure of the above-described magnetic field-applying conducting wire that extends vertically.

Figure 26:
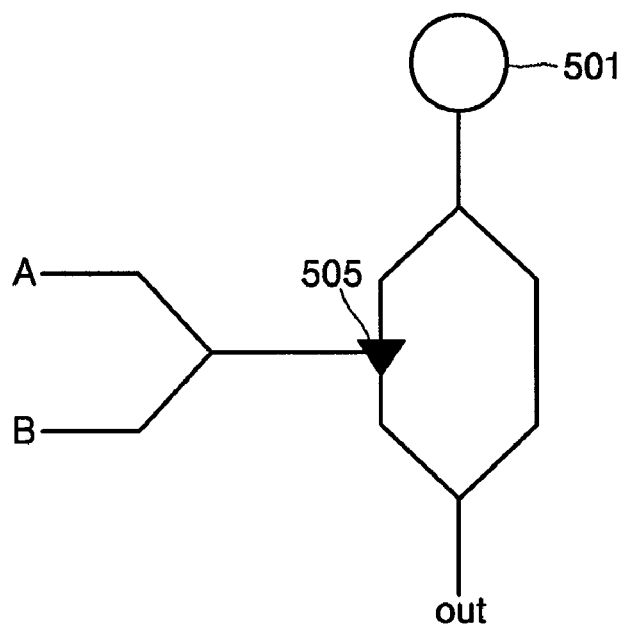
FIG. 26 is a conceptual view of an NOR gate using spin waves.

FIG. 26 is a conceptual view of a NOR gate in which A and B are set to input and out is set to output. Referring to FIG. 26, a NOR gate is a sequential arrangement of the OR gate of FIG. 23A and the inverter of FIG. 24.

In FIG. 26, when pairs of A and B are "1", "1", "1", "0", and "0", "1", respectively, stimulating signal "1" may be applied to the dynamic phase shifting apparatus 505. The spin waves generated in the device 501 for continuously generating spin waves are divided into two paths, and one of the two-path spin waves passes the dynamic phase shifting apparatus 505. Thus, the phases of the spin waves are shifted by 180 degrees. Since there is no phase change in the other spin wave, an output in which the two-path spin waves are superposed with each other, becomes "0". Only when a pair of A and B is "0", "0", a signal input to the dynamic phase shifting apparatus 505 becomes "0". The spin waves generated in the device 501 for continuously generating spin waves are divided into two paths but there is no stimulating signal in the dynamic phase shifting 505. Thus, an output in which the two spin waves are superposed with each other, becomes "1". It is obvious to one of ordinary skill in the art to actually implement such a NOR gate by employing the spin wave device according to the present invention. The device 501 for continuously generating spin waves in FIG. 26 corresponds to a first unit including a spin wave-generating unit and an energy-supplying unit, a solid line corresponds to a spin-wave waveguide, input A corresponds to a second unit, and input B corresponds to a third unit.

Figure 27:
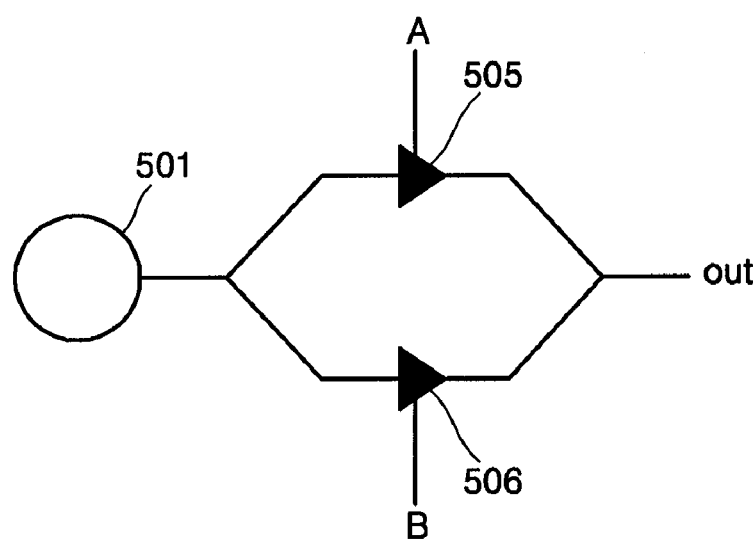
FIG. 27 is a conceptual view of an XNOR gate using spin waves.

FIG. 27 is a conceptual view of an XNOR gate in which A and B are set to input and out is set to output. Spin waves generated in the device 501 for continuously generating spin waves are divided into two paths. When signal of "1" is applied to input A, the signal becomes a stimulating signal of an upper dynamic phase shifting apparatus 505. Thus, the phase of the upper-path spin wave is shifted by 180 degrees. When signal of "1" is applied to input B, the signal becomes a stimulating signal of a lower dynamic phase shifting apparatus 506. Thus, the phase of the lower-path spin wave is shifted by 180 degrees. Thus, since the upper-path spin wave and the lower-path spin wave are overlapped with the same phase, signal of "1" is outputted to out. When input "A" is "1" and input "B" is "0", the lower-path spin wave passes the lower dynamic phase shifting apparatus 506 without phase shift. Thus, the upper-path spin wave and the lower-path spin wave have different phases and annihilate by superposition and output becomes "0". Like in the case where a pair of A and B is "0", "1", the upper-path spin wave and the lower-path spin wave have different phases and annihilate by superposition and output becomes "0". When signal "0" is applied to two input signals A and B, there is no change in the phases of the two-path spin waves. Thus, the two-path spin waves are superposed with the same phase and signal of "1" is outputted to out.

Figure 28A:
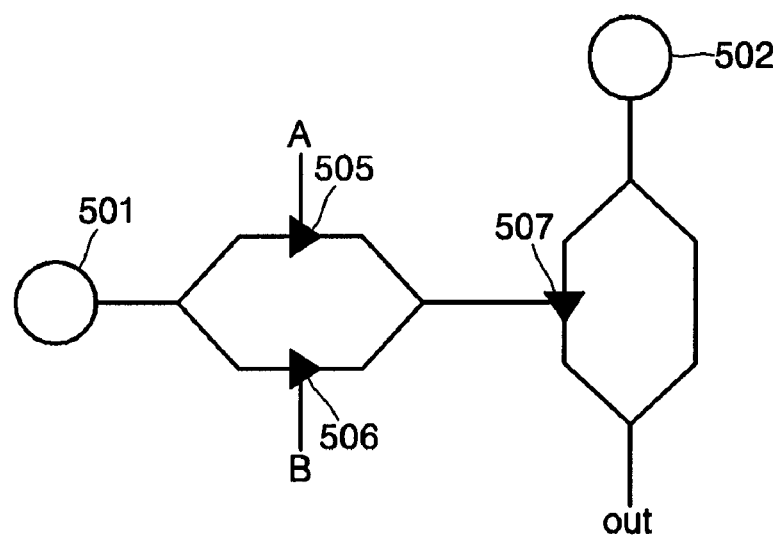
FIG. 28A is a first conceptual view of an XOR gate using spin waves.
Figure 28B:
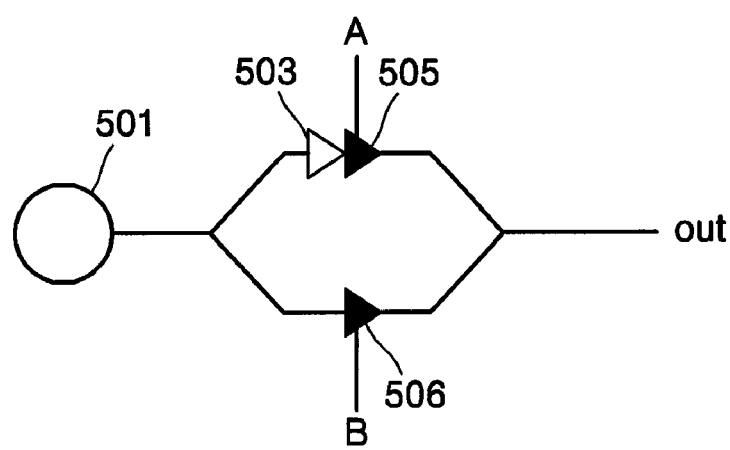
FIG. 28B is a second conceptual view thereof.
Figure 28C:
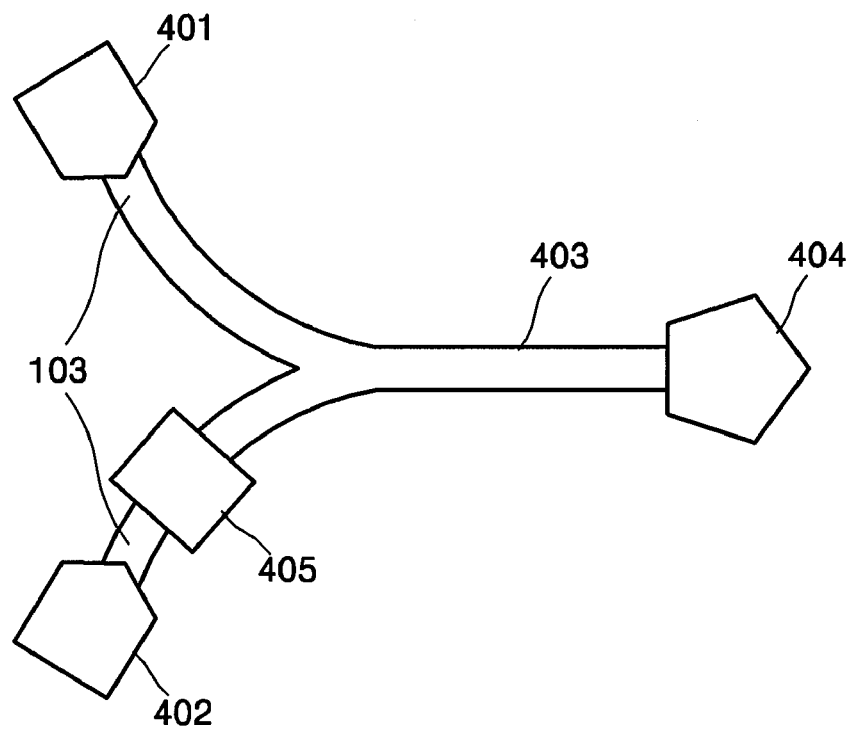
FIG. 28C illustrates an embodiment of an XOR gate by employing the spin wave device for implementing such an XOR gate according to the present invention.

FIG. 28A is a first conceptual view of XOR gate in which A and B are set to input and out is set to output, FIG. 28B is a second conceptual view thereof, and FIG. 28C illustrates an embodiment of XOR gate by employing the spin wave device for implementing such XOR gate according to the present invention. In FIGS. 28A and 28B, devices 501 and 502 for continuously generating spin waves are indicated by circle, like in FIG. 24, and a static phase shifting apparatus 503 is indicated by blank triangle. When the spin waves pass the static phase shifting apparatus 503, the phases of the spin waves are shifted by 180 degrees. Full triangle represents dynamic phase shifting apparatuses 505, 506, and 507.

Referring to FIG. 28A, an XOR gate is a sequential arrangement of the XNOR gate of FIG. 27 and the inverter of FIG. 24. An output signal generated due to a left XNOR gate is inverted by a right inverter and operates as an XOR gate.

Referring to FIG. 28B, spin waves generated in the left device 501 for continuously generating spin waves are divided into two paths. The phase of the upper-path spin wave is shifted by 180 degrees while the upper-path spin wave passes the static phase shifting apparatus 503. When signal of "1" is applied to input A, the signal becomes a stimulating signal of the upper dynamic phase shifting apparatus 505. Thus, the phase of the upper-path spin wave shifted by 180 degrees is repeatedly shifted by 180 degrees. Thus, the upper-path spin wave returns to its original phase. When signal of "1" is applied to input "B", the signal becomes a stimulating signal of the lower dynamic phase shifting apparatus 506. Thus, the phase of the lower-path spin wave is shifted by 180 degrees. Thus, the upper-path spin wave having its original phase and the lower-path spin wave shifted by 180 degrees have opposite phases and annihilate by superposition and output becomes "0". When input "A" is "1" and input "B" is "0", the lower-path spin wave passes the lower dynamic phase shifting apparatus 506 without phase shift. Thus, the upper-path spin wave and the lower-path spin wave have the same phase and overlapped output becomes "1". By applying the above description, it is obvious to one of ordinary skill in the art that, when a pair of A and B is "0", "1", out becomes "1", and when a pair of A and B is "0", "0", out becomes "0".

The device presented in FIG. 28C is an example of a simple device for implementing such an XOR gate and may be a modified example of the device illustrated in FIG. 23B. A 180-degree phase shifting apparatus 405 is disposed on one of two spin-wave waveguides 103 in which the spin-wave waveguide 103 is divided into two paths. When signal of "1" is simultaneously applied to a first unit 401 and a second unit 402, spin waves are generated, pass the spin-wave waveguide 103 and travel toward a coupling spin-wave waveguide 403. In this case, the lengths of the spin-wave waveguides 103 are the same and the 180-degree phase shifting apparatus 405 is disposed on only the one-side spin-wave waveguide 103. Thus, the two spin waves are overlapped with different phases in the coupling spin-wave waveguide 403 and the spin waves are superposed destructively and signal of "0" is outputted. The other input signal is the same in the OR gate device of FIG. 23B and the device presented in FIG. 28C operates as an XOR gate.

Figure 29:
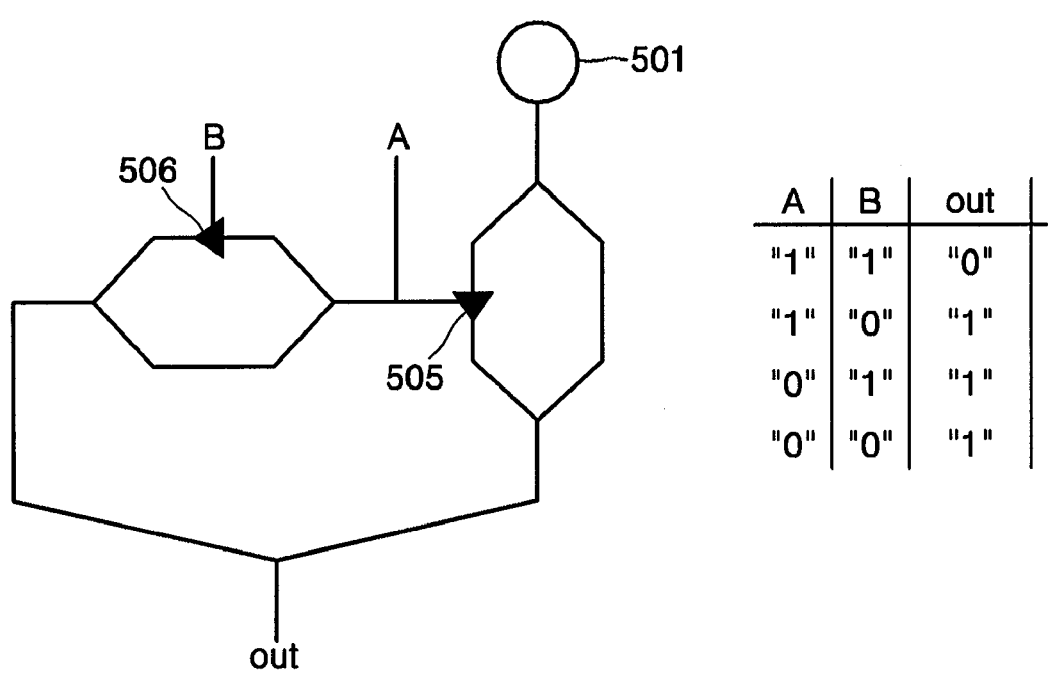
FIG. 29 is a conceptual view of a NAND gate using spin waves.

FIG. 29 is a conceptual view of a NAND gate in which A and B are set to input and out is set to output.

In FIG. 29, spin waves generated in the device 501 for continuously generating spin waves are divided into two paths, and one of the two spin waves passes a dynamic phase shifting apparatus 505. In this case, when input A is "1", the phases of the spin waves passing the upper dynamic phase shifting apparatus 505 are shifted by 180 degrees. Thus, when the two-path spin waves are superposed with each other and are outputted, state of "0" is made. Meanwhile, when input B is "1", the phases of the spin waves passing the lower dynamic phase shifting apparatus 506 of the two-path spin waves are shifted by 180 degrees. Thus, the two-path spin waves are superposed with each other and are outputted, state of "0" is made. Since "0" and "0" are superposed and outputted from the two-path spin waves, output is "0". When A is "1" and B is "0", there is no phase shift of the spin waves passing the lower dynamic phase shifting apparatus 506. Thus, when the two-path spin waves are superposed with each other and are outputted, state of "1" is made. Since "0" and "1" are superposed with each other and are outputted from the two-path spin waves, output is "1". By applying the above description, it is obvious to one of ordinary skill in the art that, when a pair of A and B is "0", "1" and even when a pair of A and B is "0", "0", out becomes "1", and when a pair of A and B is "0", "0", out becomes "1". In addition, it is obvious to one of ordinary skill in the art to actually implement such a NAND gate by employing the spin wave device according to the present invention.

Figure 30A:
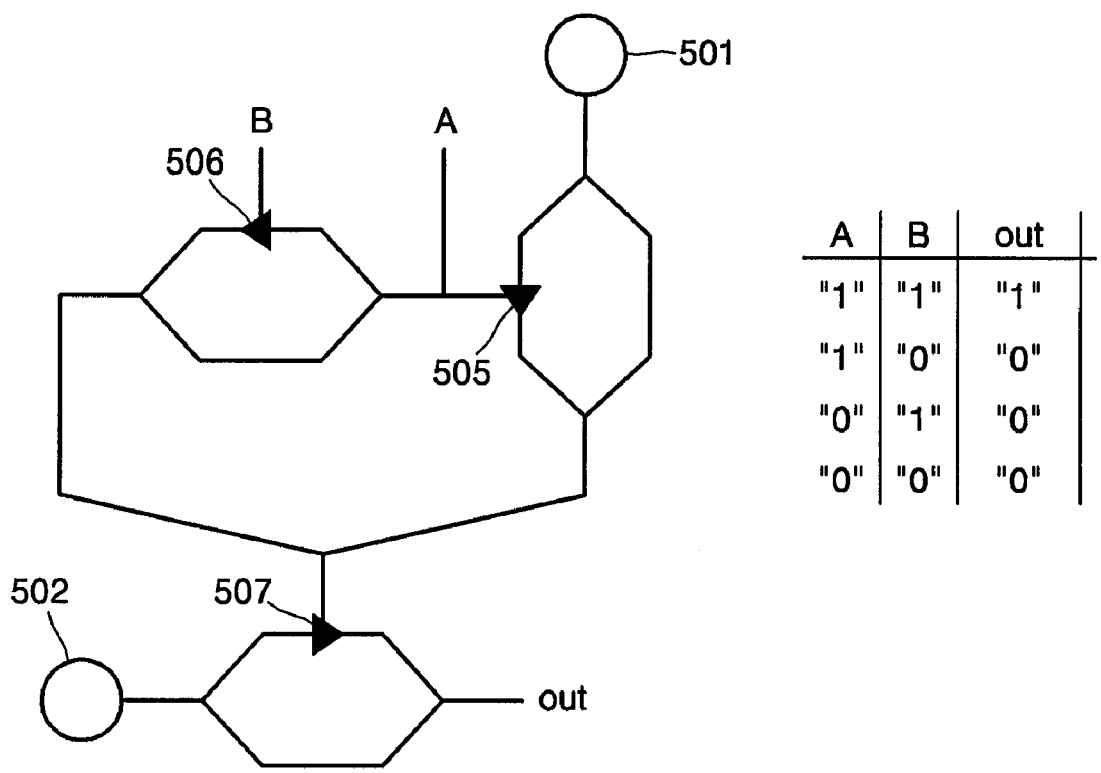
FIG. 30A is a first conceptual view of an AND gate using spin waves.
Figure 30B:
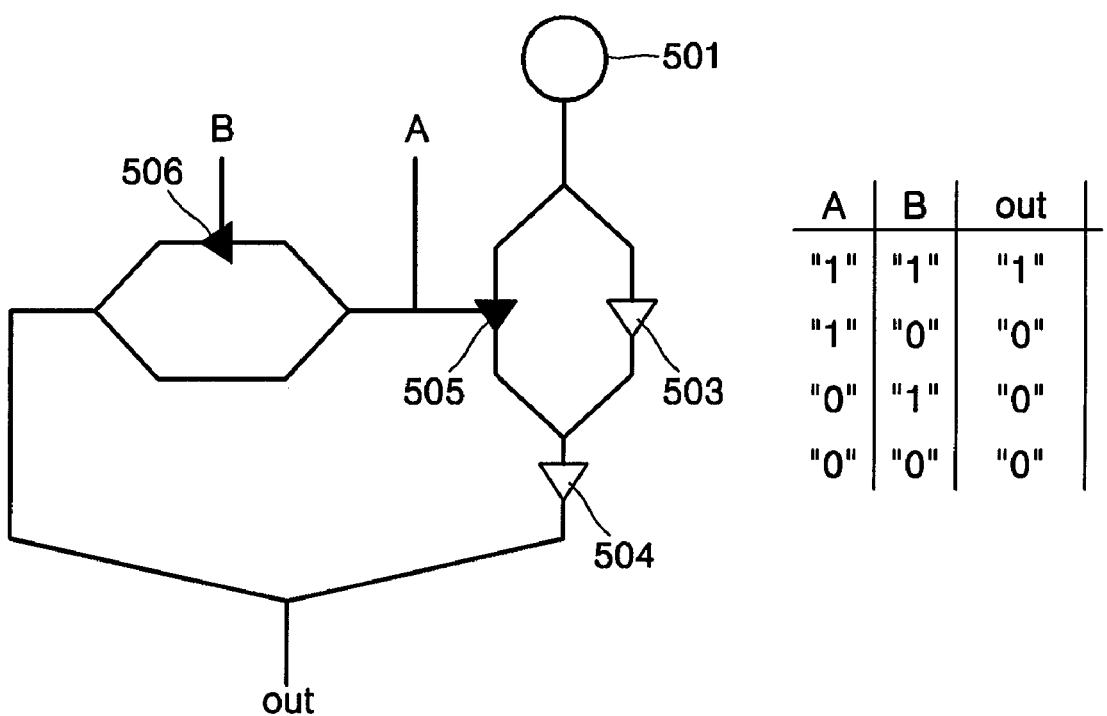
FIG. 30B is a second conceptual view thereof.

FIG. 30A is a first conceptual view of AND gate in which A and B are set to input and out is set to output, and FIG. 30B is a second conceptual view thereof.

Referring to FIG. 30A, AND gate is a sequential arrangement of a NAND gate of FIG. 29 and an inverter of FIG. 24. That is, a signal generated in an upper NAND gate is inverted by the following inverter and operates as AND gate.

In FIG. 30B, spin waves generated in the device 501 for continuously generating spin waves illustrated on the right upper end, are divided into two waves, and one of the two spin waves passes the dynamic phase shifting apparatus 505. In this case, when input A is "1", the phase of the spin wave passing the dynamic phase shifting apparatus 505 is shifted by 180 degrees. The other-path spin wave passes a static dynamic phase shifting apparatus 503 and thus is also shifted by 180 degrees. Thus, when the two-path spin waves are superposed with each other and are outputted, a spin wave whose phase is shifted by 180 degrees, exists and state of "1" is made. Then, the other-path spin wave passes another static phase shifting apparatus 504. Thus, the phase of the spin wave is shifted again and returns to its original phase. Meanwhile, when input B is "1", the phase of the spin wave passing another dynamic phase shifting apparatus 506 is shifted by 180 degrees. Thus, when the two-path spin waves are superposed with each other and are outputted, state of "0" is made. Since "1" and "0" are respectively superposed with each other and are outputted from the two-path spin waves, output becomes "1". By applying the above description, it is obvious to one of ordinary skill in the art that, when pairs of A and B are "1", "0", "0", "1", and "0", "0", out becomes "0". In addition, it is obvious to one of ordinary skill in the art to actually implement such AND gate by employing the spin wave device according to the present invention.

By properly combining the above-described logic operation means such as an OR gate, an XOR gate, a NOR gate, an AND gate, a NAND gate, and an inverter, any kind of logic operation devices can be designed and therefore logic operations using spin waves can be performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of generating spin waves, the method comprising:
   supplying an energy to a magnetic material in which magnetic vortex and magnetic antivortex spin structures exist separately or together; and
   locally generating a spin wave from a core of the magnetic vortex or the magnetic antivortex spin structure or while two vortexes collide with each other and annihilate, according to a supply of the energy.

2. The method of claim 1, further comprising deciding shape and dimension of the magnetic material so that the magnetic vortex and magnetic antivortex spin structures exist separately or together.

3. The method of claim 1, wherein the energy comprises one energy selected from the group consisting of a magnetic field, an electric field, a voltage, a current, an electromagnetic wave, sound, heat, a magnetoelastic energy, and a combination thereof.

4. The method of claim 1, wherein kind, shape, and dimension of the magnetic material or a manner for supplying the energy and the amount of the supplied energy are adjusted to control wave factors of the spin wave.

5. A method of generating electromagnetic waves and spin waves, the method comprising:
   supplying an energy to a magnetic material in which magnetic vortex and magnetic antivortex spin structures exist separately or together; and
   locally generating a spin wave from a core of the magnetic vortex or the magnetic antivortex spin structure or while two vortexes collide with each other and annihilate, according to a supply of the energy, and simultaneously generating an electromagnetic wave having the same frequency as that of the spin wave.

6. The method of claim 5, further comprising deciding shape and dimension of the magnetic material so that the magnetic vortex and magnetic antivortex spin structures exist separately or together.

7. The method of claim 5, wherein the energy comprises one energy selected from the group consisting of a magnetic field, an electric field, a voltage, a current, an electromagnetic wave, sound, heat, a magnetoelastic energy, and a combination thereof.

8. The method of claim 5, wherein kind of material, shape, and dimension of the magnetic material or a manner for supplying the energy and the amount of supplied energy are adjusted to control wave factors of the spin wave.

9. A spin wave device comprising:
   a spin wave-generating unit formed of a magnetic material in which magnetic vortex and magnetic antivortex spin structures exist separately or together;
   an energy-supplying unit supplying an energy to the spin wave-generating unit; and
   a spin-wave waveguide propagating a spin wave generated from a core of the magnetic vortex or the magnetic antivortex spin structure according to the supply of the energy, from the spin wave-generating unit.

10. The spin wave device of claim 9, wherein the magnetic material has shape and dimension so that the magnetic vortex and magnetic antivortex spin structures exist separately or together therein.

11. The spin wave device of claim 9, wherein the energy-supplying unit supplies one energy selected from the group consisting of a magnetic field, an electric field, a voltage, a current, an electromagnetic wave, sound, heat, a magnetoelastic energy, and a combination thereof.

12. The spin wave device of claim 9, wherein the magnetic material and the spin waveguide comprise one selected from the group consisting of ferromagnetic materials, antiferromagnetic materials, ferrimagnetic materials, alloy-based magnetic materials, oxide-based magnetic materials, CMR (colossal magneto resistance)-based magnetic materials, Heusler alloy-based magnetic materials, a magnetic semiconductor, and a combination thereof.

13. The spin wave device of claim 9, further comprising a substrate supporting the spin wave-generating unit and the spin-wave waveguide, wherein the energy-supplying unit comprises:
   a magnetic field-applying conducting wire formed at both sides of the substrate under the spin wave-generating unit; and a power unit applying a magnetic field to a portion of the spin wave-generating unit or the entire spin wave-generating unit by flowing a current through the magnetic field-applying conducting wire.

14. The spin wave device of claim 9, wherein the energy-supplying unit comprises:
a laser light source; and
a focusing lens focusing a beam of the laser light source on the spin wave-generating unit to heat the spin wave-generating unit.

15. The spin wave device of claim 9, wherein the energy-supplying unit comprises:
a first conducting wire extending horizontally from a lower portion of the spin wave-generating unit;
a second conducting wire extending horizontally from an upper portion of the spin wave-generating unit while forming a predetermined angle with the first conducting wire; and
a power unit generating a spin wave by an action of a torque generated due to a current that is spin-polarized in the spin wave-generating unit by flowing a current through the first and second conducting wires.

16. The spin wave device of claim 15, wherein the energy-supplying unit further comprises a piezoelectric body being elastically deformed by a voltage flowing through the first and second conducting wires and supplying a magnetoelastic energy to the spin wave-generating unit.

17. The spin wave device of claim 9, further comprising a plurality of units including the spin wave-generating unit and the energy-supplying unit, wherein the units are connected to one another by the spin-wave waveguide.

18. The spin wave device of claim 17, wherein a nonlinear portion of the spin-wave waveguide is curve-shaped.

19. The spin wave device of claim 9 or 17, wherein a waveguide formed of a different kind or the same kind of magnetic material from or as a material used in forming the spin-wave waveguide is inserted in the spin-wave waveguide.

20. The spin wave device of claim 19, wherein a frequency of a traveling spin wave is selectively filtered or one selected from the group consisting of wavelength, amplitude and phase of the traveling spin waves, and a combination thereof is changed by changing at least one of shape, dimension, and a magnetic material of the inserted waveguide.

21. The spin wave device of claim 9 or 17, wherein one of wavelength, amplitude and phase of the spin wave, and a combination thereof is changed by causing a change of an effective magnetic field locally in the spin-wave waveguide.

22. The spin wave device of claim 21, wherein the effective magnetic field is changed by one of an external magnetic field, a stray field, elastic deformation, magnetic anisotropy, exchange coupling with other magnetic material, a current, a spin torque, and an existence of a magnetic domain wall.

23. The spin wave device of claim 21, further comprising a magnetic layer joined to the spin-wave waveguide, wherein the effective magnetic field is changed by an exchange coupling with an interface between the spin-wave waveguide and the magnetic layer.

24. The spin wave device of claim 21, wherein a magnetic domain wall exists in the spin-wave waveguide, and the effective magnetic field is changed by the existence of the magnetic domain wall.

25. The spin wave device of claim 24, wherein the magnetic domain wall is one magnetic domain wall selected from the group consisting of a 90-degree magnetic domain wall, a 180-degree magnetic domain wall, a 360-degree magnetic domain wall, a Bloch-shaped magnetic domain wall, a Neel-shaped magnetic domain wall, and a combination thereof.

26. The spin wave device of claim 21, wherein the effective magnetic field is changed by inserting or removing a magnetic domain wall in or from the spin-wave waveguide.

27. The spin wave device of claim 26, further comprising:
a magnetic field-applying conducting wire extending vertically to a spin waveguide; and
a magnetic domain wall waveguide in which the magnetic domain wall can move and which surrounds the magnetic field-applying conducting wire and whose both ends being connected to the spin-wave waveguide,
wherein the magnetic domain wall is moved by an Oersted field formed around the magnetic field-applying conducting wire by flowing a current through the magnetic field-applying conducting wire.

28. The spin wave device of claim 26, further comprising:
a magnetic domain wall waveguide in which the magnetic domain wall can move and whose middle portion excluding both ends being connected to the spin-wave waveguide; and
a power unit connected to one of both ends of the magnetic domain wall waveguide,
wherein the magnetic domain wall is moved by flowing a current through the magnetic domain wall waveguide using the power unit.

29. The spin wave device of claim 26, further comprising:
a magnetic domain wall waveguide in which the magnetic domain wall can move and whose middle portion excluding both ends being connected to the spin-wave waveguide; and
an additional spin wave-generating unit connected to one end or both ends of the magnetic domain wall waveguide,
wherein the magnetic domain wall is moved by generating a spin wave in the additional spin wave-generating unit and by propagating the spin waves through the magnetic domain wall waveguide.

30. The spin wave device of claim 21, further comprising a magnetic domain wall waveguide in which a magnetic domain wall can move across the spin-wave waveguide, wherein a stray field is generated using the magnetic domain wall and the effective magnetic field is changed by moving the magnetic domain wall.

31. The spin wave device of claim 21, further comprising:
a magnetic field-applying conducting wire going across the spin-wave waveguide; and
a power unit connected to the magnetic field-applying conducting wire,
wherein the effective magnetic field is changed by an Oersted field formed around the spin-wave waveguide by flowing a current through the magnetic field-applying conducting wire using the power unit.

32. The spin wave device of claim 21, wherein the spin-waveguide is divided into two paths vertically or horizontally and the effective magnetic field is changed by forming an Oersted field by disposing a conducting wire through which a current flows in a direction in which the conducting wire extends vertically or horizontally while forming a predetermined angle with the spin-wave waveguide between the two paths.

33. The spin wave device of claim 21, further comprising:
a first conducting wire extending horizontally from a lower portion of the spin-wave waveguide; and
a second conducting wire extending horizontally from an upper portion of the spin-wave waveguide,
wherein the effective magnetic field is changed by an action of a torque generated due to a current that is spin-polarized in a local area of the spin-wave waveguide by flowing a current through the first and second conducting wires.

34. The spin wave device of claim 33, further comprising a piezoelectric body between the spin-wave waveguide and the first conducting wire or between the spin-wave waveguide and the second conducting wire, wherein the effective magnetic field is changed by elastic deformation of the piezoelectric body due to a voltage flowing through the first and second conducting wires.

35. The spin wave device of claim 17, wherein the units are connected to one another to control wave factors of the spin waves to perform logic operations.

36. The spin wave device of claim 35, wherein the wave factors comprise one wave factor selected from the group consisting of frequency, wavelength, amplitude and phase of the spin wave, and a combination thereof, and a change of the wave factors is controlled to perform logic operations.

37. The spin wave device of claim 35, wherein logic operations are performed by a change of the wave factors using a one or composite action of superposition, reflection, refraction, transmission, radiation, diffraction, and interference of the spin wave.

38. A method of controlling phases of spin waves by which the phases of the spin waves are changed by causing a change of an effective magnetic field locally in a spin-wave waveguide in which the spin waves travel.

39. The method of claim 38, wherein the effective magnetic field is changed by one selected from a stray field, elastic deformation, magnetic anisotropy, exchange coupling with other magnetic material, a current, and a spin torque.

40. The method of claim 38, wherein the effective magnetic field is changed by moving the magnetic domain wall by an Oersted field formed around the magnetic field-applying conducting wire by flowing a current through the magnetic field-applying conducting wire, by using a magnetic field-applying conducting wire extending vertically to the spin-wave waveguide and a magnetic domain wall waveguide in which the magnetic domain wall can move and which surrounds the magnetic field-applying conducting wire and whose both ends being connected to the spin-wave waveguide.

41. The method of claim 38, wherein the effective magnetic field is changed by moving the magnetic domain wall by flowing a current through the magnetic domain wall waveguide, by using a magnetic domain wall waveguide in which the magnetic domain wall can move and whose middle portion excluding both ends being connected to the spin wave waveguide and a power unit connected to one of both ends of the magnetic domain wall waveguide.

42. The method of claim 38, wherein the effective magnetic field is changed by moving the magnetic domain wall by propagating a spin wave generated in an additional spin wave-generating unit through the magnetic domain wall waveguide, by using a magnetic domain wall waveguide in which the magnetic domain wall can move and whose middle portion excluding both ends being connected to the spin-wave waveguide and the additional spin wave-generating unit connected to one of both ends of the magnetic domain wall waveguide.

43. The method of claim 38, wherein a magnetic domain wall waveguide in which a magnetic domain wall can move across the spin-wave waveguide is further disposed, and wherein a stray field is generated using the magnetic domain wall and the effective magnetic field is changed by moving the magnetic domain wall.

44. The method of claim 38, wherein the spin-waveguide is divided into
two paths vertically or horizontally and the effective magnetic field is changed by forming an Oersted field by disposing a conducting wire through which a current flows in a direction in which the spin-wave waveguide extends vertically or horizontally while forming a predetermined angle with the spin-wave waveguide between the two paths.

45. The method of claim 38, wherein a first conducting wire extending horizontally from a lower portion of the spin-wave waveguide, and a second conducting wire extending horizontally from an upper portion of the spin-wave waveguide are further disposed, and wherein the effective magnetic field is changed by an action of a torque generated due to a current that is spin-polarized in a local area of the spin-wave waveguide by flowing a current through the first and second conducting wires.

46. The method of claim 38, wherein a piezoelectric body between
the spin-wave waveguide and the first conducting wire or between the spin-wave waveguide and the second conducting wire is further disposed, and wherein the effective magnetic field is changed by elastic deformation of the piezoelectric body due to a voltage flowing through the first and second conducting wires.

* * * * *